(12) United States Patent
Tsukuda et al.

(10) Patent No.: US 12,660,590 B2
(45) Date of Patent: Jun. 16, 2026

(54) SEMICONDUCTOR DEVICE

(71) Applicant: Mitsubishi Electric Corporation, Tokyo (JP)

(72) Inventors: Masanori Tsukuda, Tokyo (JP); Akihisa Yamamoto, Tokyo (JP); Tatsuya Kawase, Tokyo (JP); Masaki Sudo, Tokyo (JP); Shinya Soneda, Tokyo (JP); Hidenori Fujii, Tokyo (JP); Tomohide Terashima, Tokyo (JP); Takaya Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 455 days.

(21) Appl. No.: 18/471,561

(22) Filed: Sep. 21, 2023

(65) Prior Publication Data

US 2024/0203830 A1 Jun. 20, 2024

(30) Foreign Application Priority Data

Dec. 14, 2022 (JP) ................................. 2022-199342

(51) Int. Cl.
    *H01L 23/48*     (2006.01)
    *H10D 12/00*     (2025.01)
    (Continued)

(52) U.S. Cl.
    CPC .......... *H10W 20/20* (2026.01); *H10D 12/481* (2025.01); *H10D 84/811* (2025.01); *H10D 89/60* (2025.01)

(58) Field of Classification Search
    CPC .. H01L 23/481; H10D 12/481; H10D 84/811; H10D 89/60
    See application file for complete search history.

(56) References Cited

U.S. PATENT DOCUMENTS

| | | | | |
|---|---|---|---|---|
| 5,040,042 A | * | 8/1991 | Bauer | H10D 18/80 |
| | | | | 257/133 |
| 9,799,731 B2 | * | 10/2017 | Alexander | H10D 62/177 |

(Continued)

FOREIGN PATENT DOCUMENTS

| | | |
|---|---|---|
| JP | 2003-514381 A | 4/2003 |
| JP | 2008-192998 A | 8/2008 |

(Continued)

OTHER PUBLICATIONS

An Office Action; "Notice of Reasons for Refusal," mailed by the Japanese Patent Office on Oct. 7, 2025, which corresponds to Japanese Patent Application No. 2022-199342 and is related to U.S. Appl. No. 18/471,561; with English language translation.

(Continued)

*Primary Examiner* — J. E. Schoenholtz
(74) *Attorney, Agent, or Firm* — Studebaker Brackett PLLC

(57) ABSTRACT

A semiconductor device includes: a first control electrode and a second control electrode for switching that are formed in a first main surface and a second main surface, respectively, of a semiconductor substrate; a first control electrode pad electrically connected to the first control electrode; a first through-via penetrating the semiconductor substrate in a thickness direction and including a conductor electrically connecting the first main surface to the second main surface; and a second control electrode pad formed on the first main surface and electrically connected to the second control electrode through the first through-via.

11 Claims, 18 Drawing Sheets

(51) Int. Cl.
  H10D 84/80 (2025.01)
  H10D 89/60 (2025.01)
  H10W 20/20 (2026.01)

(56) References Cited

U.S. PATENT DOCUMENTS

| | | | |
|---|---|---|---|
| 12,382,648 B2 * | 8/2025 | Matsudai | H10D 12/481 |
| 2002/0060330 A1 * | 5/2002 | Onishi | H10D 30/658 |
| | | | 257/E29.264 |
| 2015/0333134 A1 * | 11/2015 | Hirler | H01L 21/76898 |
| | | | 257/329 |
| 2017/0077273 A1 | 3/2017 | Kitagawa | |
| 2021/0057555 A1 * | 2/2021 | Satoh | H02M 7/003 |
| 2023/0299691 A1 * | 9/2023 | Satoh | H02M 1/08 |
| | | | 363/131 |

FOREIGN PATENT DOCUMENTS

| | | | |
|---|---|---|---|
| JP | 2010-123667 A | 6/2010 | |
| JP | 2017-054968 A | 3/2017 | |
| JP | 2021-034506 A | 3/2021 | |
| WO | 01/35465 A1 | 5/2001 | |

OTHER PUBLICATIONS

T. Saraya, et al., "3.3 kV Back-Gate-Controlled IGBT (BC-IGBT) Using Manufacturable Double-Side Process Technology", 2020 IEEE International Electron Devices Meeting (IEDM), DOI: 10.1109/IEDM13553.2020.9371909,: 5.3.1-5.3.4, 2020.

* cited by examiner

F I G. 4
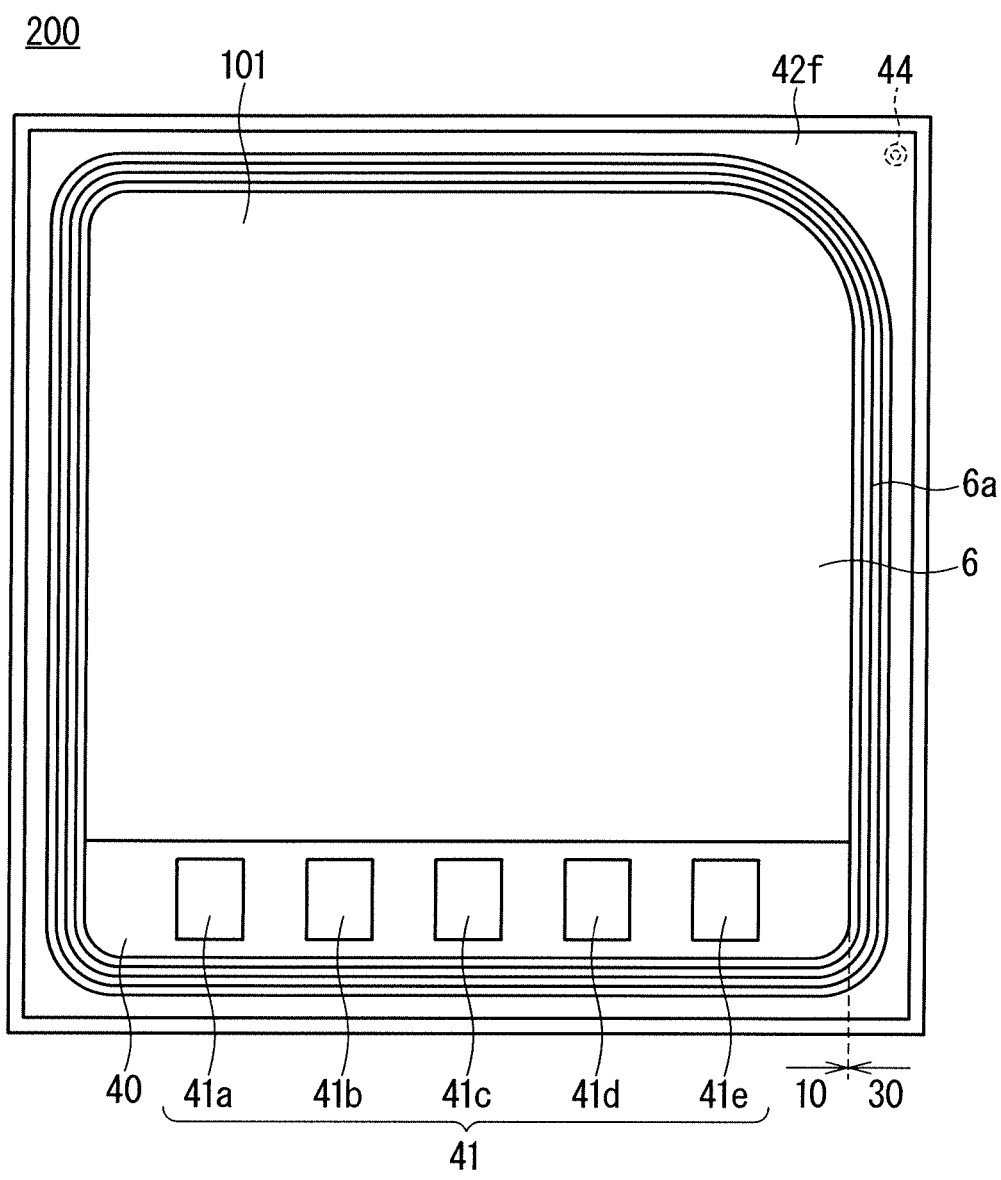

F I G. 6
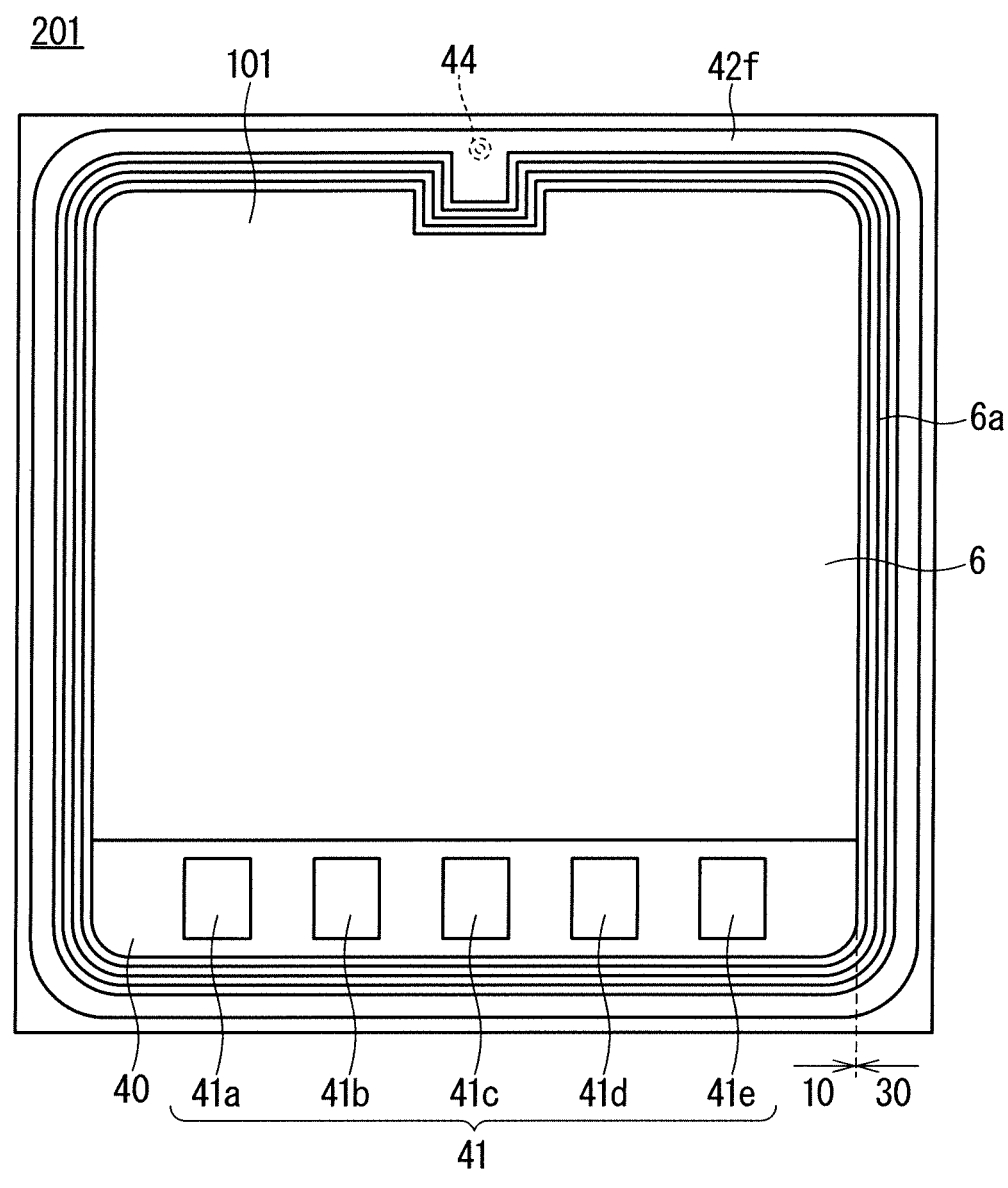

F I G. 8
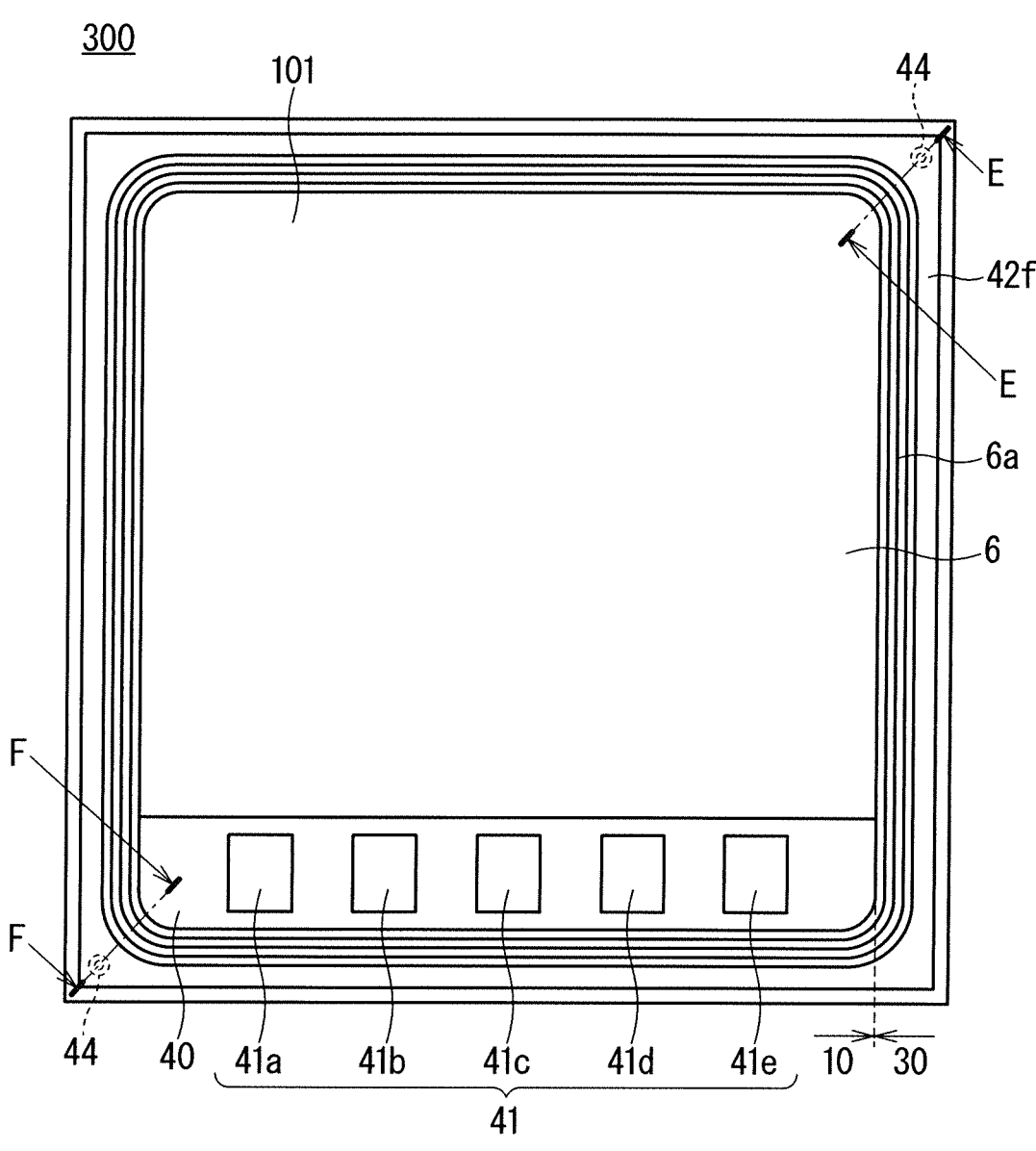

F I G. 1 0
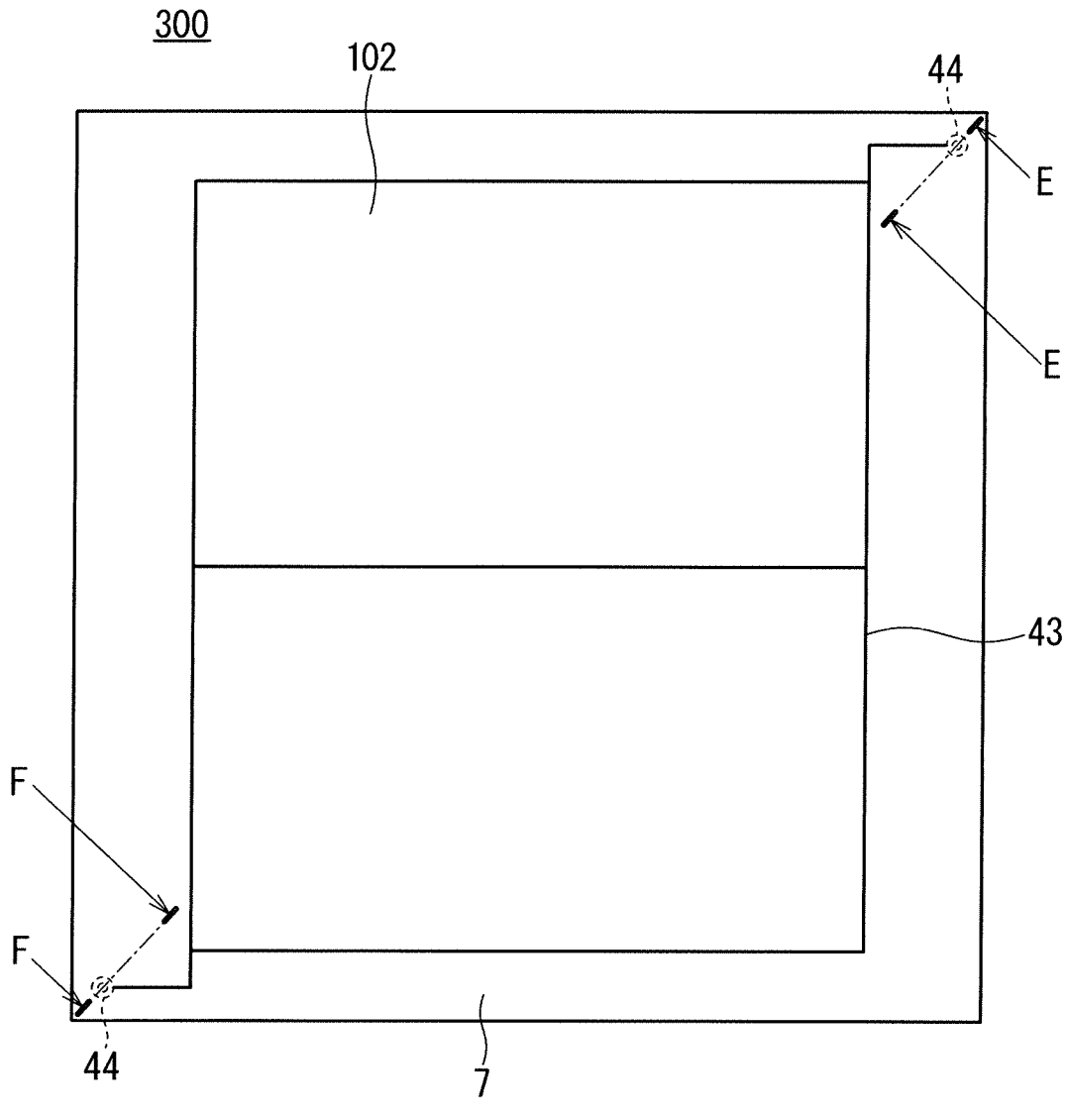

F I G. 1 1
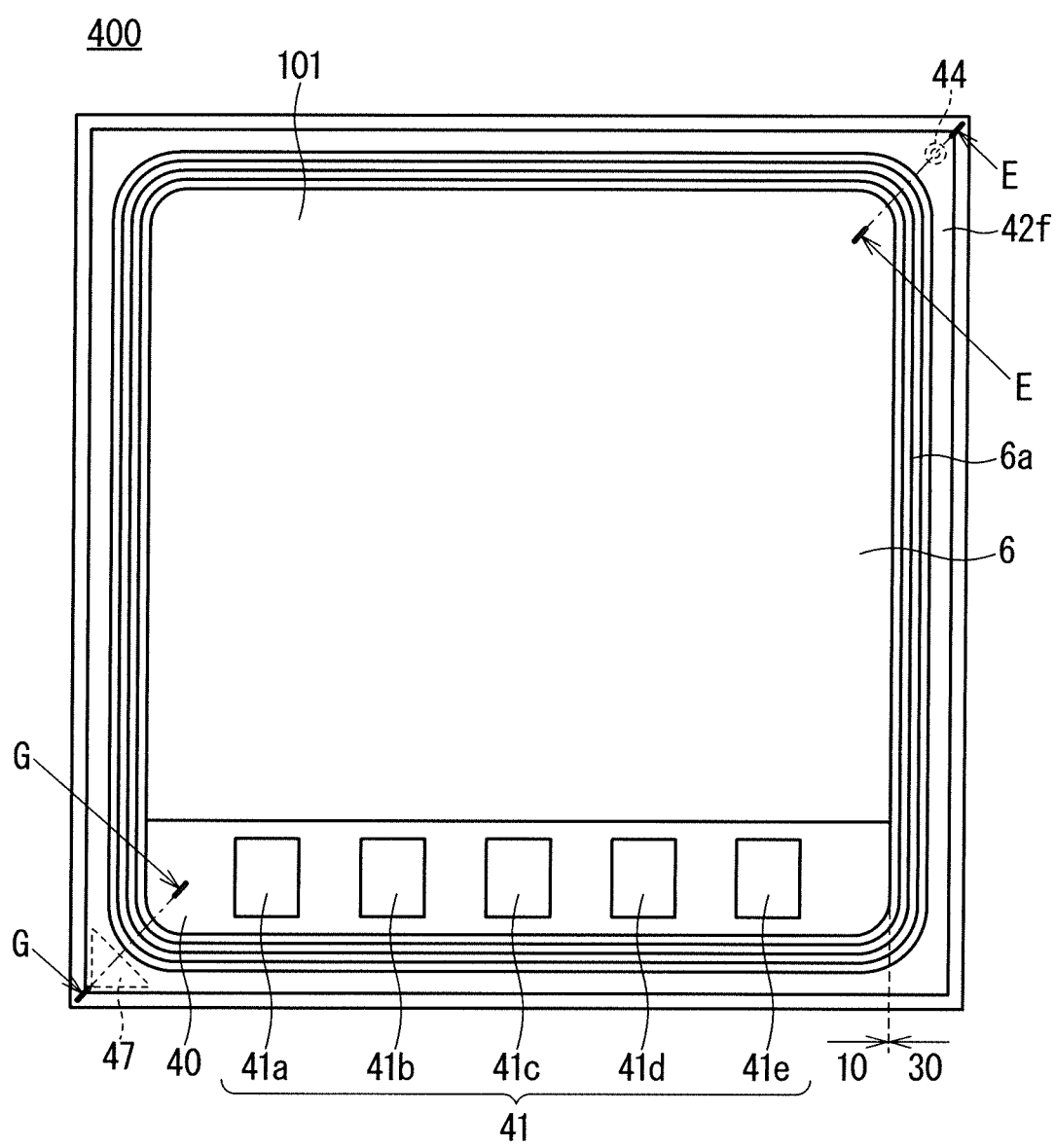

F I G. 13
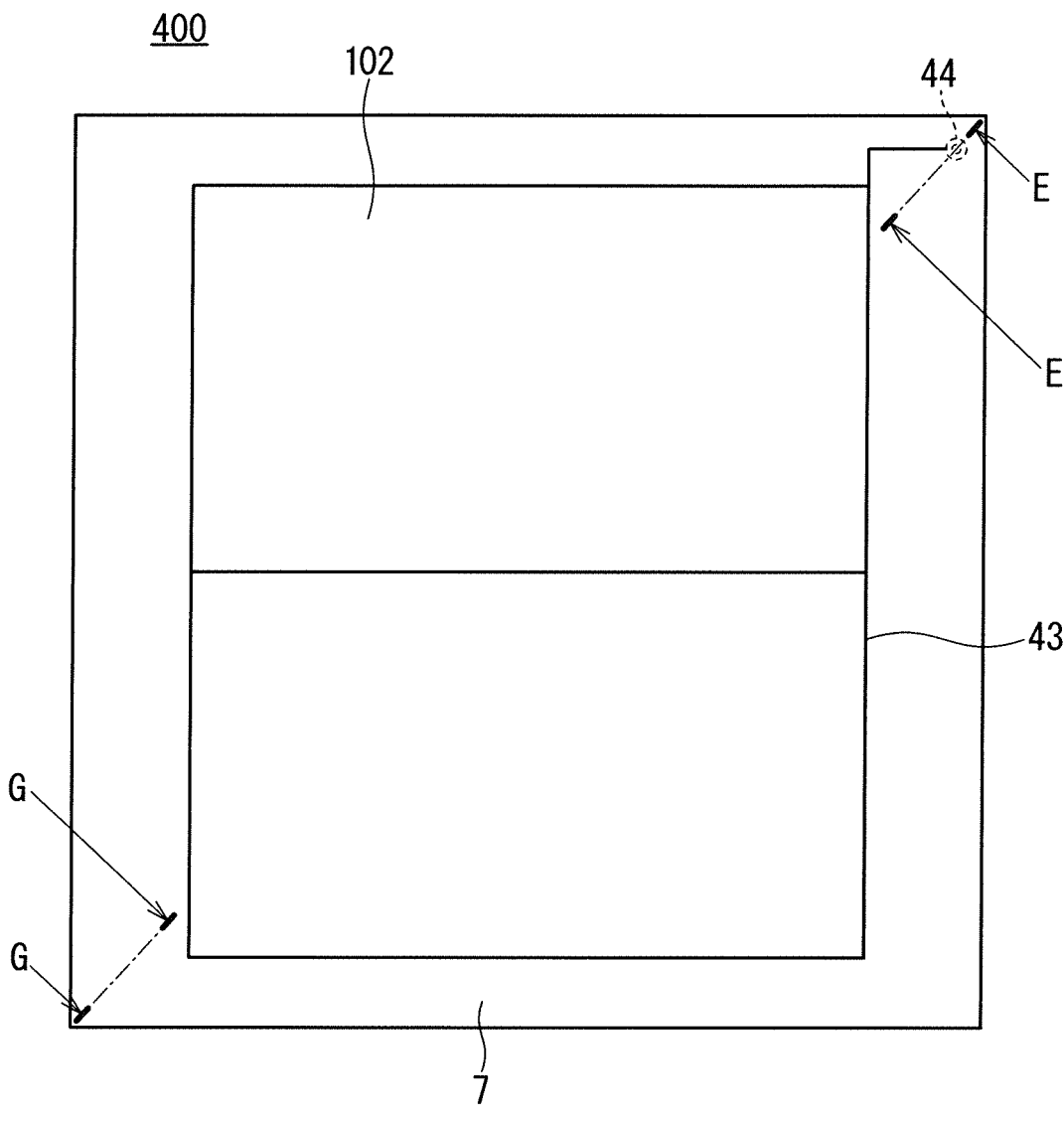

F I G. 1 4
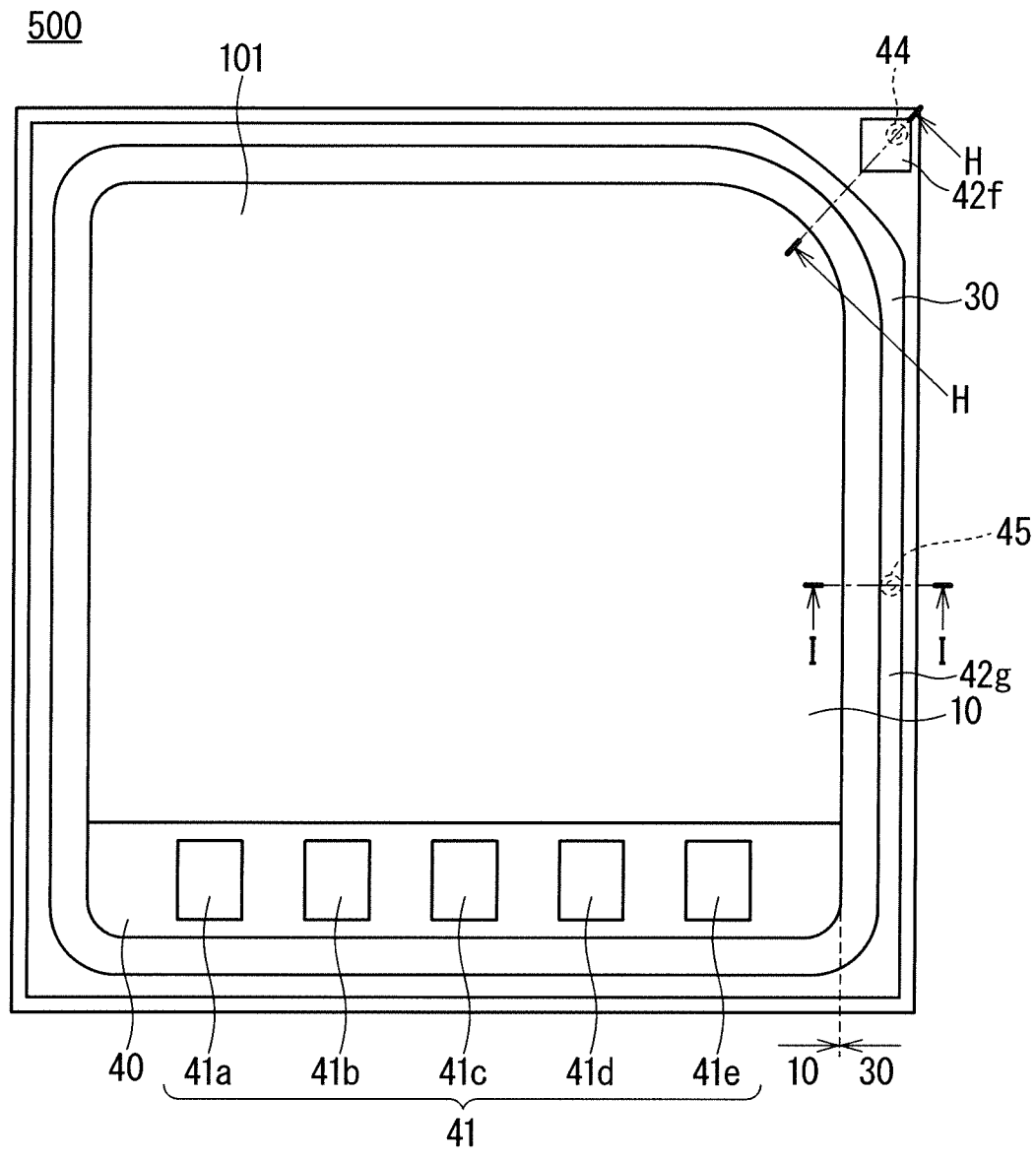

F I G. 15
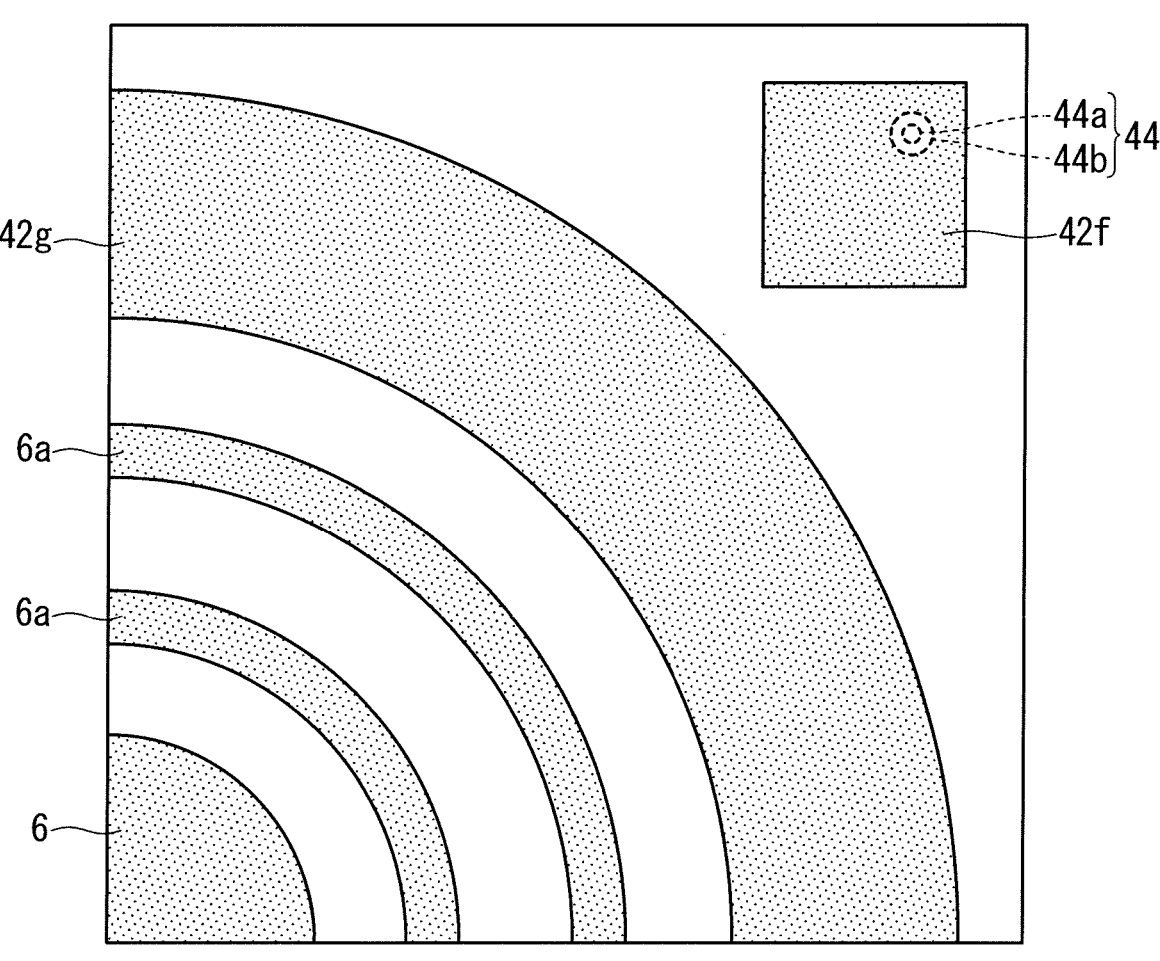

F I G. 17
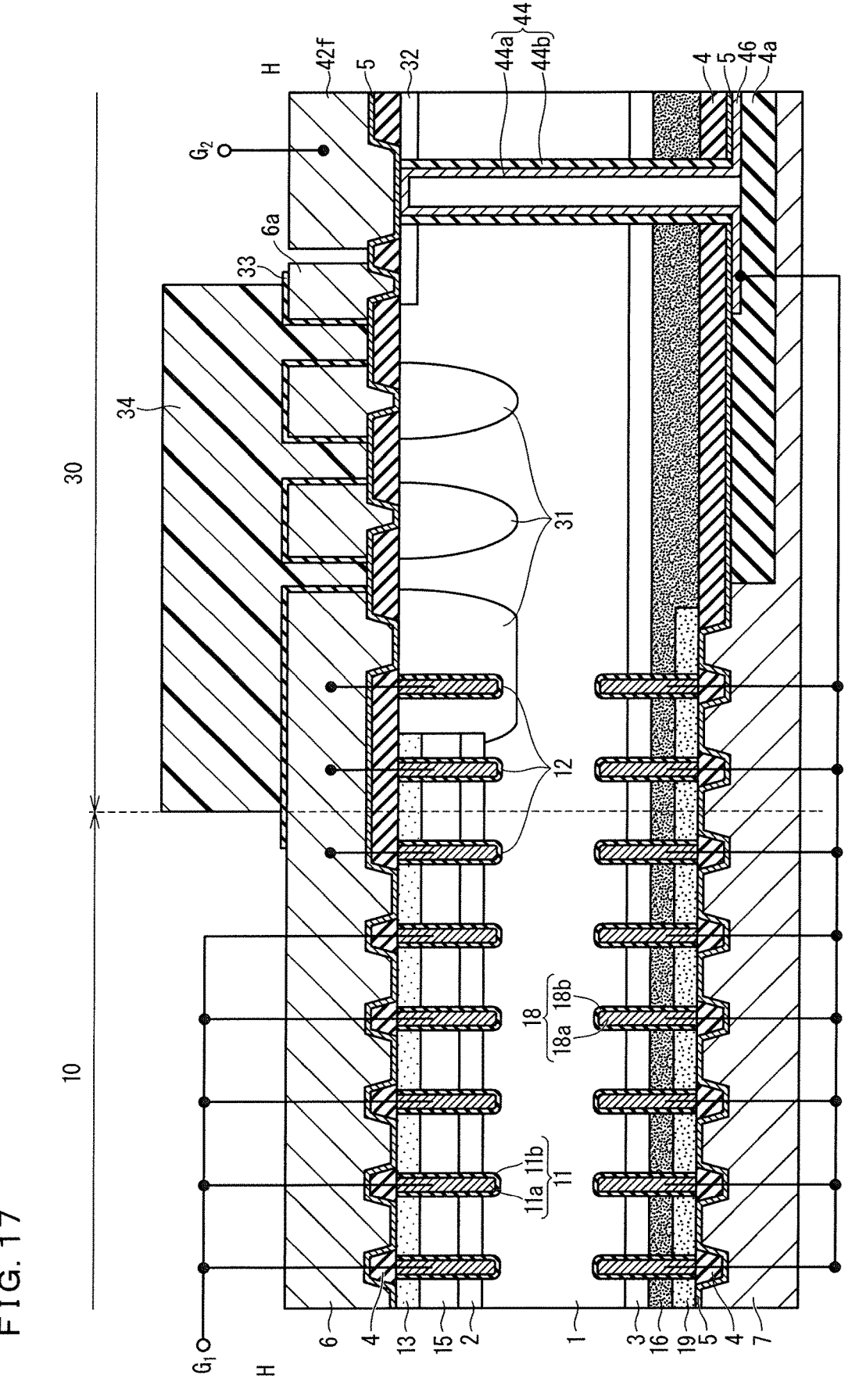

SEMICONDUCTOR DEVICE

BACKGROUND OF THE INVENTION

Field of the Invention

The present disclosure relates to a semiconductor device, and particularly to a semiconductor device with a double gate structure.

Description of the Background Art

Double gate insulated-gate bipolar transistors (IGBTs) to which a double gate structure as disclosed in Japanese Patent Application Laid-Open No. 2021-34506 is applied have been developed to improve the switching performance of IGBTs.

The double gate IGBTs each have a structure in which gate electrodes are formed in a main surface closer to an emitter electrode and control gate electrodes are formed in a main surface closer to a collector electrode opposite to the emitter electrode.

In the double gate IGBT disclosed in Japanese Patent Application Laid-Open No. 2021-34506, a control gate electrode pad electrically connected to the control gate electrodes is exposed on a backside closer to the collector electrode.

A technology for connecting wires to the control gate electrode pad on the backside by wire bonding can support small volume production, but has a problem in supporting high volume production.

SUMMARY

The object of the present disclosure is to provide a semiconductor device which has a structure including gate electrodes on the backside and whose high volume production is possible.

A semiconductor device according to the present disclosure is a semiconductor device including a semiconductor substrate with a first main surface and a second main surface which face one another, the semiconductor device including: a first semiconductor layer of a first conductivity type, the first semiconductor layer being formed between the first main surface and the second main surface of the semiconductor substrate; a second semiconductor layer of a second conductivity type, the second semiconductor layer being formed between the first semiconductor layer and the first main surface; a third semiconductor layer of the first conductivity type, the third semiconductor layer being selectively formed on the second semiconductor layer on the first main surface side; a fourth semiconductor layer of the second conductivity type, the fourth semiconductor layer being formed between the first semiconductor layer and the second main surface; a fifth semiconductor layer of the first conductivity type, the fifth semiconductor layer being selectively formed on the fourth semiconductor layer on the second main surface side; a first main electrode on the first main surface, the first main electrode being electrically connected to the second semiconductor layer and the third semiconductor layer; a second main electrode on the second main surface, the second main electrode being electrically connected to the fourth semiconductor layer and the fifth semiconductor layer; a first control electrode switching between conduction and non-conduction between the first semiconductor layer and the third semiconductor layer according to a first control signal; a second control electrode switching between conduction and non-conduction between the first semiconductor layer and the fifth semiconductor layer according to a second control signal; a first control electrode pad on the first main surface, the first control electrode pad being electrically connected to the first control electrode; a breakdown voltage maintaining structure in a terminal region surrounding a pad disposing region on which the first main electrode and the first control electrode pad are disposed; a first through-via including a conductor electrically connecting the first main surface to the second main surface, the first through-via penetrating the semiconductor substrate in a thickness direction; and a second control electrode pad on the first main surface, the second control electrode pad being electrically connected to the second control electrode through the first through-via.

In the semiconductor device according to the present disclosure, only the second main electrode is exposed on the second main surface of the semiconductor substrate, and the second control electrode pad is disposed on the first main surface. This indicates that the second main surface has an electrode pattern identical to those of conventional semiconductor devices. Thus, wiring in the semiconductor device is possible using conventional soldering and wire bonding. Consequently, high volume production of this semiconductor device is possible.

These and other objects, features, aspects, and advantages of the present invention will become more apparent from the following detailed description of the present invention when taken in conjunction with the accompanying drawings.

BRIEF DESCRIPTION OF THE DRA WINGS

FIG. 4 is a plan view illustrating a front pattern of a double gate RC-IGBT according to Embodiment 2 of the present disclosure;

FIG. 6 is a plan view illustrating a front pattern of a double gate RC-IGBT according to a modification of Embodiment 2 of the present disclosure;

FIG. 8 is a plan view illustrating a front pattern of a double gate RC-IGBT according to Embodiment 3 of the present disclosure;

FIG. 10 is a plan view illustrating a backside pattern of the double gate RC-IGBT according to Embodiment 3 of the present disclosure;

FIG. 11 is a plan view illustrating a front pattern of a double gate RC-IGBT according to Embodiment 4 of the present disclosure;

FIG. 13 is a plan view illustrating a backside pattern of the double gate RC-IGBT according to Embodiment 4 of the present disclosure;

FIG. 14 is a plan view illustrating a front pattern of a double gate RC-IGBT according to Embodiment 5 of the present disclosure;

FIG. 15 is an enlarged partial view illustrating the front pattern of the double gate RC-IGBT according to Embodiment 5 of the present disclosure;

FIG. 17 is a partial cross-sectional view of the double gate RC-IGBT according to Embodiment 5 of the present disclosure.

DESCRIPTION OF THE PREFERRED EMBODIMENTS

Introduction

Figure 1:
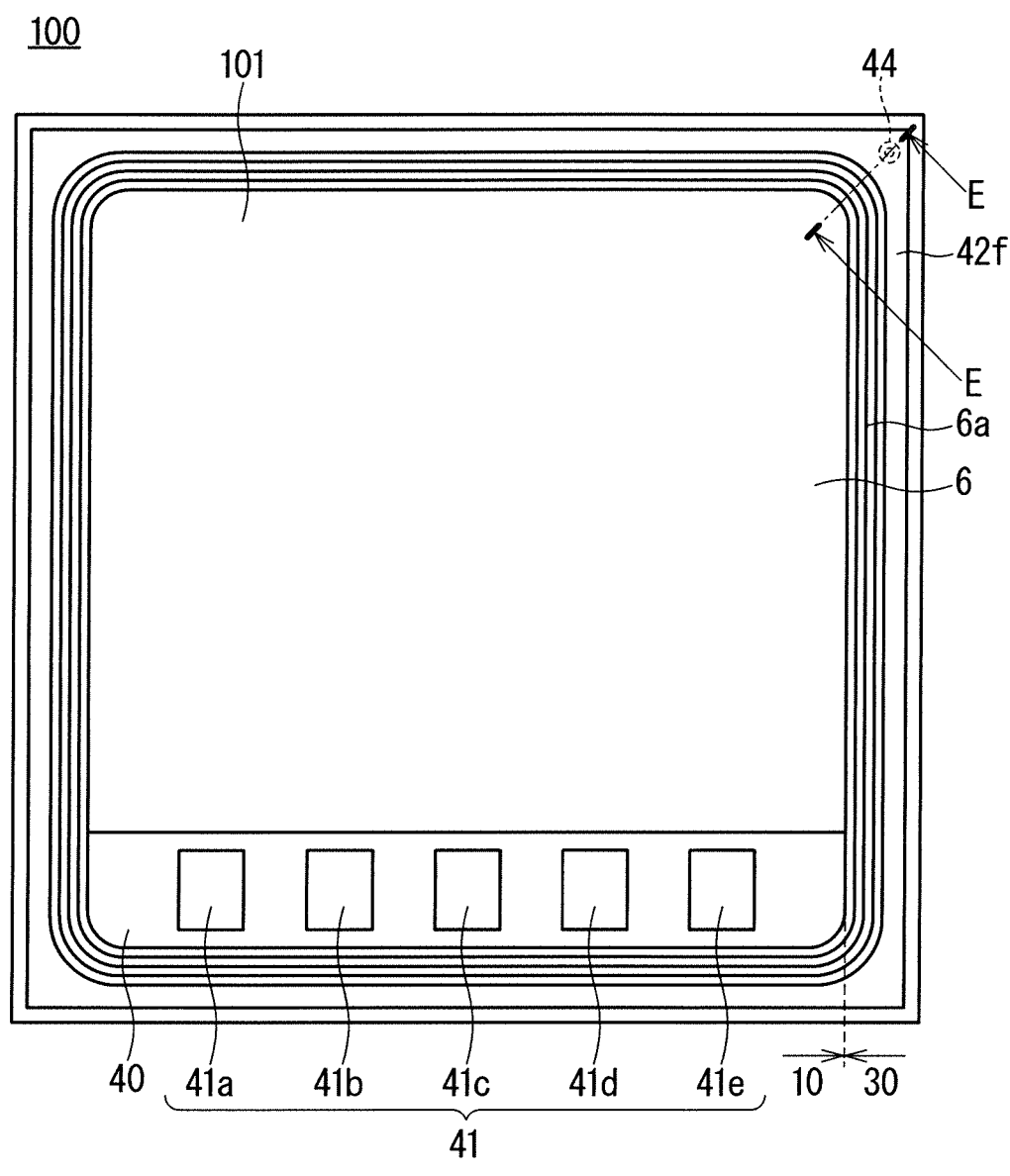
FIG. 1 is a plan view illustrating a front pattern of a double gate RC-IGBT according to Embodiment 1 of the present disclosure.

Although n-type and p-type indicate semiconductor conductivity types, the first conductivity type is n-type, and the second conductivity type is p-type in the description of this disclosure, conversely, the first conductivity type may be p-type and the second conductivity type may be n-type. Furthermore, n$^-$ type represents an impurity concentration lower than that of n-type, and n$^+$ type represents an impurity concentration higher than that of n-type. Similarly, p$^-$ type represents an impurity concentration lower than that of p-type, and p$^+$ type represents an impurity concentration higher than that of p-type.

Since the drawings are schematically illustrated, the mutual relationships in size and position between images in the different drawings are not necessarily accurate but may be appropriately changed. In the following description, the same reference numerals are assigned to the same constituent elements, and their names and functions are the same. Thus, the detailed description thereof may be omitted.

Although the description below sometimes uses the words representing particular positions and directions including "up", "down", "side", "front", and "back", these are used for convenience to facilitate the understanding of the details of Embodiments, and do not relate to the directions for actual use.

In the following description, "outside" means a direction toward the periphery of a semiconductor substrate, and "inside" means a direction opposite to the "outside".

Although an example of a double gate reverse-conducting (RC) IGBT including a double gate IGBT in an IGBT region will be described as an RC-IGBT including an IGBT and a freewheeling diode (FWD) on a common semiconductor substrate in the following description, the application of the present disclosure is not limited to this. The present disclosure is applicable to a double gate IGBT including an IGBT solely on a semiconductor substrate, and to a double gate metal-oxide-semiconductor field-effect transistor (MOSFET).

Since a diode region including a FWD has a low relevance to the present disclosure, the illustrations, etc., are omitted in this disclosure.

Although a double gate RC-IGBT with a structure including trench gate electrodes as gate electrodes and control gate electrodes will be exemplified hereinafter, the application of the present disclosure is not limited to this. The present disclosure is applicable to a double gate RC-IGBT with a structure in which one of or both of the gate electrodes and the control gate electrodes are planar gate electrodes.

Embodiment 1

FIG. 1 is a plan view illustrating a front pattern 101 on which an emitter electrode 6 (a first main electrode) is disposed in a double gate RC-IGBT 100 according to Embodiment 1 of the present disclosure.

As illustrated in FIG. 1, the front pattern 101 includes a pad region 40 that is a pad disposing region, adjacent to an IGBT region 10 at the bottom on the plane of the paper. The pad region 40 is a region on which a control pad 41 for controlling the double gate RC-IGBT 100 is disposed. The IGBT region 10 and a diode region that is not illustrated are collectively referred to as a cell region. A terminal region 30 for maintaining the breakdown voltage of the double gate RC-IGBT 100 is disposed around a region obtained by combining the cell region and the pad region 40. The terminal region 30 may have a known breakdown voltage maintaining structure appropriately selected. The breakdown voltage maintaining structure can be established by, for example, a field limiting ring (FLR) surrounding the cell region with a p-type termination well layer of a p-type semiconductor, and variation of lateral doping (VLD) surrounding the cell region with a p-type well layer with a concentration slope on a first main surface that is a front of the double gate RC-IGBT 100.

The control pad 41 can include a current sense pad 41a, a Kelvin emitter pad 41b, a gate pad 41c, and temperature sensing diode pads 41d and 41e. The current sense pad 41a is a control pad for sensing a current flowing through the cell region, and is a control pad electrically connected to an IGBT cell or a diode cell, which is a part of the cell region, so that a fraction to one several ten-thousandth of the current flowing through the entirety of the cell region flows through the current sense pads 41a, when the current flows through the cell region.

The Kelvin emitter pad 41b and the gate pad 41c (a first control electrode pad) are control pads to which a gate drive voltage for controlling on/off of the double gate RC-IGBT 100 is applied. The Kelvin emitter pad 41b is electrically connected to a p-type base layer of the IGBT cell, and the gate pad 41c is electrically connected to gate trench electrodes of the IGBT cell. The temperature sensing diode pads 41d and 41e are control pads electrically connected to an anode and a cathode of a temperature sensing diode included in the double gate RC-IGBT 100. The temperature sensing diode pads 41d and 41e measure voltages between the anode and the cathode of the temperature sensing diode that is included in the cell region and is not illustrated to measure the temperature of the double gate RC-IGBT 100.

The terminal region 30 includes a plurality of concentric terminal electrodes 6a outside the combined region of the cell region and the pad region 40, as the breakdown voltage maintaining structure. A rim region further outside the terminal electrodes 6a includes a final backside gate pad 42f (a second control electrode pad) surrounding the rim region. A silicon through-via 44 (a first through-via) is formed at a lower portion of one of corners of the final backside gate pad 42f. Although the silicon through-via 44 covered with the final backside gate pad 42*f* cannot be visually checked from the top, the silicon through-via 44 is illustrated by broken lines for convenience.

Figure 2:
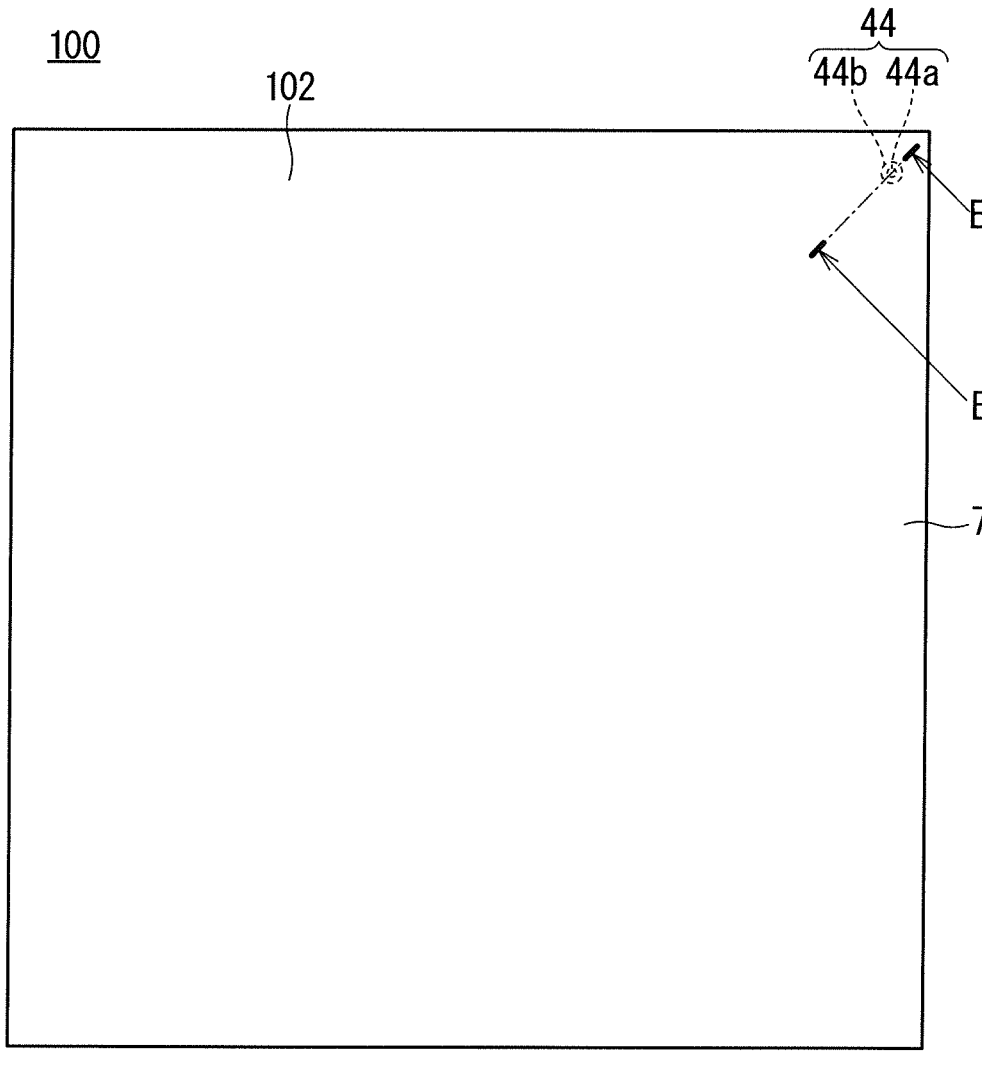
FIG. 2 is a plan view illustrating a backside pattern of the double gate RC-IGBT according to Embodiment 1 of the present disclosure.

FIG. 2 is a plan view illustrating a backside pattern 102 on which a collector electrode 7 (a second main electrode) is disposed in the double gate RC-IGBT 100, and is a plan view when viewed from the front by omitting the constituent elements other than the collector electrode 7. All plan views subsequent to FIG. 2 which illustrate the backside pattern 102 are plan views when viewed from the front by omitting the constituent elements other than the collector electrode 7. As illustrated in FIG. 2, the silicon through-via 44 is formed at a position corresponding to one of corners of the collector electrode 7.

Figure 3:
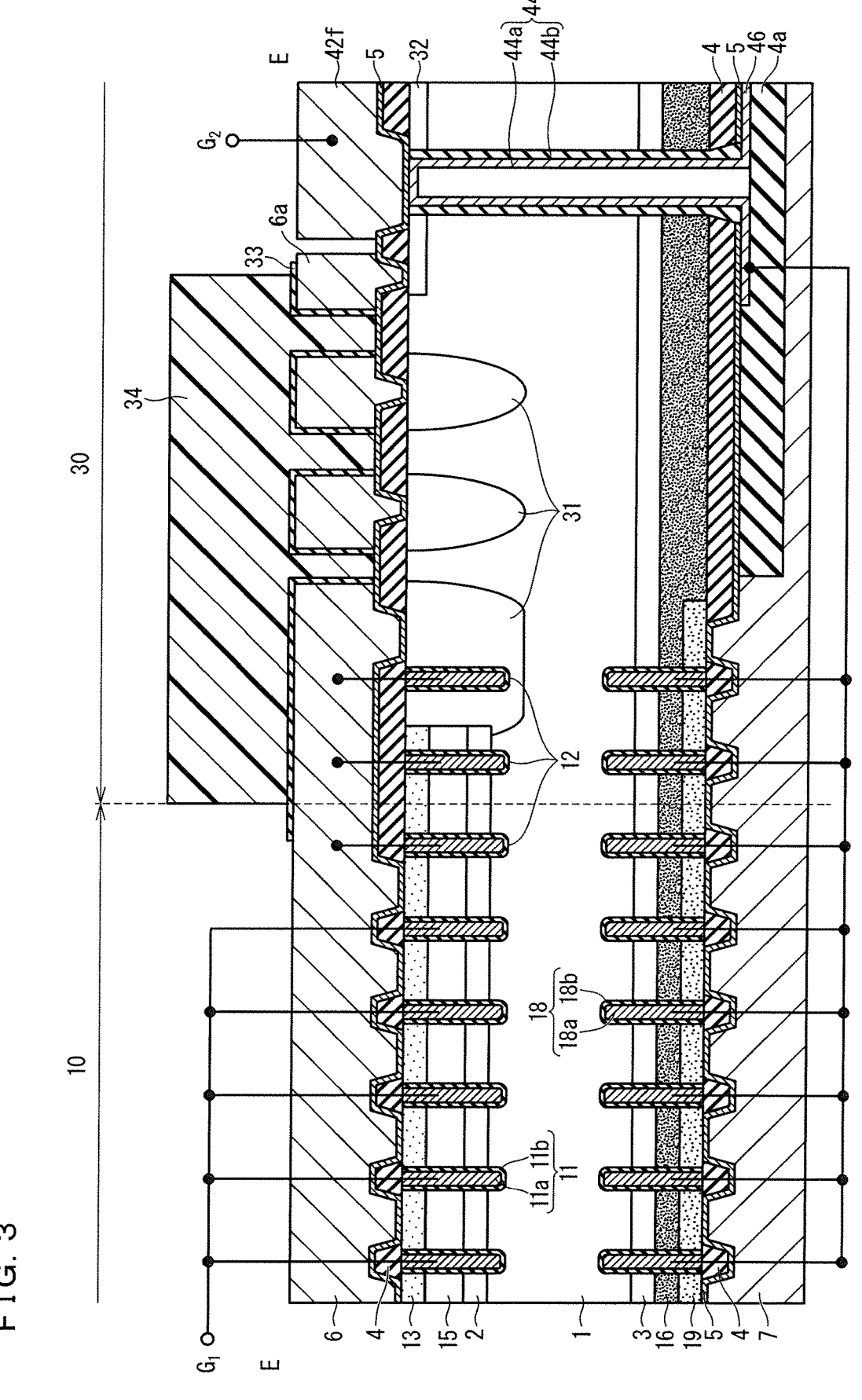
FIG. 3 is a partial cross-sectional view of the double gate RC-IGBT according to Embodiment 1 of the present disclosure.

FIG. 3 is a cross-sectional view taken along an alternate long and short dashed line E-E of the double gate RC-IGBT 100 in FIG. 1. The double gate RC-IGBT 100 in FIG. 3 includes an n$^-$ type drift layer 1 (a first semiconductor layer) included in a semiconductor substrate. The n$^-$ type drift layer 1 is a semiconductor layer containing, for example, arsenic or phosphorus as n-type impurities. A concentration of the n-type impurities ranges from $1.0 \times 10^{12}/\text{cm}^3$ to $1.0 \times 10^{15}/\text{cm}^3$.

IGBT Region

As illustrated in FIG. 3, the IGBT region 10 includes a plurality of active trench gates 11 arranged in stripes at regular intervals in an upper surface of the semiconductor substrate on the first main surface side.

Each of the active trench gates 11 is formed by embedding a gate trench electrode 11*a* (a first control electrode) through a gate trench insulating film 11*b* in a trench formed in the semiconductor substrate. The gate trench electrodes 11*a* of the active trench gates 11 are electrically connected to the gate pad 41*c* (a first gate pad) illustrated in FIG. 1, and are supplied with a gate signal G$_1$ (a first control signal).

An n$^+$ type source layer 13 (a third semiconductor layer) is formed across both sides of the active trench gates 11 in a width direction to be in contact with the gate trench insulating films 11*b*. The n$^+$ type source layer 13 is a semiconductor layer containing, for example, arsenic or phosphorus as n-type impurities. A concentration of the n-type impurities ranges from $1.0 \times 10^{17}/\text{cm}^3$ to $1.0 \times 10^{20}/\text{cm}^3$.

Furthermore, the IGBT region 10 includes an n-type carrier storage layer 2 higher in n-type impurity than the n$^-$ type drift layer 1 on the n$^-$ type drift layer 1 on the first main surface side as illustrated in FIG. 3. The n-type carrier storage layer 2 is a semiconductor layer containing, for example, arsenic or phosphorus as n-type impurities. A concentration of the n-type impurities ranges from $1.0 \times 10^{13}/\text{cm}^3$ to $1.0 \times 10^{17}/\text{cm}^3$. The n-type carrier storage layer 2 can reduce the conduction loss when a current flows through the IGBT region 10. The n-type carrier storage layer 2 and the n$^-$ type drift layer 1 can be collectively referred to as a drift layer.

The p-type base layer 15 (a second semiconductor layer) is formed on the n-type carrier storage layer 2 on the first main surface side. The p-type base layer 15 is a semiconductor layer containing, for example, boron or aluminum as p-type impurities. A concentration of the p-type impurities ranges from $1.0 \times 10^{12}/\text{cm}^3$ to $1.0 \times 10^{19}/\text{cm}^3$. The p-type base layer 15 is in contact with the gate trench insulating films 11*b* of the active trench gates 11. The n$^+$ type source layer 13 is formed on the p-type base layer 15 on the first main surface side to be in contact with the gate trench insulating films 11*b* of the active trench gates 11. The n$^+$ type source layer 13 makes up the first main surface of the semiconductor substrate.

Although only the n$^+$ type source layer 13 is connected to the emitter electrode 6 in FIG. 3, a p$^+$ type contact layer is connected to the emitter electrode 6 in a depth direction of FIG. 3 that is not illustrated.

The gate trench electrodes 11*a* face the n$^-$ type drift layer 1 through the gate trench insulating films 11*b*. The gate trench insulating films 11*b* of the active trench gates 11 are in contact with the p-type base layer 15 and the n$^+$ type source layer 13. When a gate drive voltage is applied to the gate trench electrodes 11*a*, a channel is formed in the p-type base layer 15 that is in contact with the gate trench insulating films 11*b* of the active trench gates 11.

An interlayer insulating film 4 is formed on the gate trench electrodes 11*a* of the active trench gates 11. The interlayer insulating film 4 on the gate trench electrodes 11*a* of the active trench gates 11 insulates the gate trench electrodes 11*a* from the emitter electrode 6 so that the gate trench electrodes 11*a* receive the gate signal G$_1$.

A barrier metal 5 is formed on a region without the interlayer insulating film 4 on the first main surface of the semiconductor substrate, and on the interlayer insulating film 4. The barrier metal 5 can be, for example, a conductor containing titanium (Ti), e.g., a conductor made of TiSi obtained by alloying silicon (Si) with titanium nitride or titanium. The barrier metal 5 is in Ohmic contact with and electrically connected to the n$^+$ type source layer 13. The emitter electrode 6 is disposed on the barrier metal 5. The emitter electrode 6 can be made of, for example, an aluminum alloy such as an aluminum silicon alloy (an Al—Si based alloy). The emitter electrode 6 can also be an electrode obtained by forming, on an electrode made of an aluminum alloy, a metal film with a plurality of layers on each of which a plated film is formed by electroless plating or electroplating. The plated films formed by electroless plating or electroplating can be, for example, nickel (Ni) plated films. When the double gate RC-IGBT 100 includes a fine region between the emitter electrode 6 and the adjacent interlayer insulating film 4 and the fine region is not sufficiently embedded by the emitter electrode 6, tungsten with embedded properties better than those of the emitter electrode 6 can be disposed on the fine region and then the emitter electrode 6 can be disposed on the tungsten. The emitter electrode 6 can be disposed on the n$^+$ type source layer 13 without the barrier metal 5. Furthermore, the barrier metal 5 can be disposed only on n-type semiconductor layers such as the n$^+$ type source layer 13. The barrier metal 5 and the emitter electrode 6 can be collectively referred to as an emitter electrode.

As illustrated in FIG. 3, a plurality of active trench gates 18 (second gates) are arranged in stripes at regular intervals in a lower surface of the semiconductor substrate on a second main surface side.

Each of the active trench gates 18 is formed by embedding a gate trench electrode 18*a* (a second control electrode) through a gate trench insulating film 18*b* in a trench formed in the semiconductor substrate. The gate trench electrodes 18*a* of the active trench gates 18 are electrically connected to the final backside gate pad 42*f* formed in the terminal region 30 on the first main surface side, and are supplied with a gate signal G$_2$ (a second control signal).

As illustrated in FIG. 3, an n$^+$ type collector layer 19 (a fifth semiconductor layer), a p-type collector layer 16 (a fourth semiconductor layer), and an n-type buffer layer 3 are formed from the second main surface of the semiconductor substrate in this order on the second main surface side of the n⁻ type drift layer 1 in the IGBT region 10. These impurity layers are in contact with the gate trench insulating films 18b across both sides of the active trench gates 18 in the width direction. Furthermore, the bottom of the active trench gates 18 reaches the n⁻ type drift layer 1.

The n-type buffer layer 3 suppresses punch-through of a depletion layer extending from the p-type base layer 15 toward the second main surface side when the double gate RC-IGBT 100 is in an OFF state. The n-type buffer layer 3 can be formed by injecting, for example, one of or both of phosphorus (P) and proton (H⁺). The n-type buffer layer 3 has a concentration of n-type impurities ranging from $1.0\times10^{12}/\text{cm}^3$ to $1.0\times10^{18}/\text{cm}^3$.

The p-type collector layer 16 is a semiconductor layer containing, for example, boron or aluminum as p-type impurities. A concentration of the p-type impurities ranges from $1.0\times10^{12}/\text{cm}^3$ to $1.0\times10^{19}/\text{cm}^3$. The p-type collector layer 16 makes up the second main surface of the semiconductor substrate.

The n⁺ type collector layer 19 is a semiconductor layer containing, for example, arsenic or phosphorus as n-type impurities. A concentration of the n-type impurities ranges from $1.0\times10^{17}/\text{cm3}$ to $1.0\times10^{20}/\text{cm3}$.

Although only the n⁺ type collector layer 19 is connected to the collector electrode 7 in FIG. 3, the p-type collector layer 16 is connected to the collector electrode 7 in the depth direction of FIG. 3 that is not illustrated.

An interlayer insulating film 4 is disposed on the gate trench electrodes 18a of the active trench gates 18. The interlayer insulating film 4 on the gate trench electrodes 18a of the active trench gates 18 insulates the gate trench electrodes 18a from the collector electrode 7 so that the gate trench electrodes 18a receive the gate signal G₂.

A barrier metal 5 is formed on a region without the interlayer insulating film 4 on the second main surface of the semiconductor substrate, and on the interlayer insulating film 4.

Terminal Region

As illustrated in FIG. 3, the terminal region 30 includes the n⁻ type drift layer 1 between the first main surface and the second main surface of the semiconductor substrate. The first main surface and the second main surface of the terminal region 30 are flush with the first main surface and the second main surface of the IGBT region 10, respectively. Furthermore, the n⁻ type drift layer 1 of the terminal region 30 has the same structure as that in the IGBT region 10. Then type drift layer 1 is continuously and integrally formed.

P-type terminal well layers 31 are formed in the n⁻ type drift layer 1 on the first main surface side, that is, between the first main surface and the n⁻ type drift layer 1. The p-type terminal well layers 31 are semiconductor layers containing, for example, boron or aluminum as p-type impurities. A concentration of the p-type impurities ranges from $1.0\times10^{14}/\text{cm3}$ to $1.0\times10^{19}/\text{cm3}$. The terminal region 30 includes the plurality of concentric p-type terminal well layers 31 to surround the cell region including the IGBT region 10. The number of the p-type terminal well layers 31 is appropriately selected according to the design of a breakdown voltage of the double gate RC-IGBT 100. Furthermore, a p⁺ type contact layer 32 is formed around an outer edge of the p-type terminal well layers 31 to surround the p-type terminal well layers 31.

The n-type buffer layer 3, the p-type collector layer 16, and the n⁺ type collector layer 19 extend from the IGBT region 10, between the n⁻ type drift layer 1 and the second main surface of the semiconductor substrate. However, the n⁺ type collector layer 19 extends up to a region of the terminal region 30 which includes the active trench gates 18.

A boundary between the IGBT region 10 and the terminal region 30 includes a plurality of dummy trench gates 12 identical in cross section to the active trench gates 11, in the semiconductor substrate on the first main surface side. The dummy trench gates 12 are arranged in stripes in the same manner as the active trench gates 11. At least one of the dummy trench gates 12 is formed in the p-type terminal well layers 31.

The plurality of dummy trench gates 12 are covered with the continuous interlayer insulating film 4, and are electrically connected to the emitter electrode 6 through contacts penetrating the interlayer insulating film 4 in a portion that is not illustrated.

The terminal region 30 includes the emitter electrode 6 continuous from the IGBT region 10, and the plurality of terminal electrodes 6a separated from the emitter electrode 6. The emitter electrode 6 is electrically connected to the terminal electrodes 6a through a semi-insulating film 33. The semi-insulating film 33 can be, for example, a semi-insulating silicon nitride (sinSiN) film. The terminal electrodes 6a, the p-type terminal well layers 31, and the p⁺ type contact layer 32 are electrically connected to each other through contact holes formed in the interlayer insulating film 4 on the first main surface in the terminal region 30. Furthermore, the terminal region 30 includes a terminal protective film 34 covering the emitter electrode 6, the terminal electrodes 6a, and the semi-insulating film 33. The terminal protective film 34 can be made of, for example, polyimide.

The rim region outside an end face of the terminal protective film 34 includes the final backside gate pad 42f in the same layer as that of the emitter electrode 6. The final backside gate pad 42f is electrically connected to the silicon through-via 44 penetrating the semiconductor substrate in a thickness direction.

In the terminal region 30, the interlayer insulating film 4 is continuously formed on the second main surface of the semiconductor substrate, and is covered with the barrier metal 5. The silicon through-via 44 penetrates the barrier metal 5 and the interlayer insulating film 4.

The silicon through-via 44 includes a silicon through-via insulating film 44b covering an inner wall of a via hole penetrating the semiconductor substrate in the thickness direction, and a silicon through-via electrode 44a covering an inner wall of the silicon through-via insulating film 44b. The silicon through-via electrode 44a also covers the barrier metal 5 around the via hole on the second main surface side. The silicon through-via electrode 44a covering the barrier metal 5 around the via hole can be referred to as a backside gate pad 46.

The gate trench electrodes 18a of the active trench gates 18 are electrically connected to the silicon through-via electrode 44a through contacts penetrating the interlayer insulating film 4 in a portion that is not illustrated. The silicon through-via electrode 44a is connected to the barrier metal 5 on the first main surface side, and is electrically connected to the final backside gate pad 42f through the barrier metal 5. Thus, the gate trench electrodes 18a are supplied with the gate signal G₂.

The silicon through-via 44 and the backside gate pad 46 around the silicon through-via 44 are covered with an interlayer insulating film 4a, and are electrically separated from the collector electrode 7 covering the interlayer insulating film 4a.

In FIG. 3, the silicon through-via electrode 44a covers the inner wall of the silicon through-via insulating film 44b, and does not fill the silicon through-via 44, thus hollowing out the silicon through-via 44. However, the silicon through-via 44 is not limited to this. For example, the silicon through-via electrode 44a, an insulator, or a semiconductor can fill the silicon through-via 44. As long as the silicon through-via 44 is connected to the final backside gate pad 42f through the silicon through-via electrode 44a, the silicon through-via 44 may be filled with something or hollowed out.

There is no limit on a material of the silicon through-via electrode 44a as long as the silicon through-via electrode 44a is made of a conductor of a low resistance. Examples of the available material include polysilicon, doped polysilicon, and metals such as copper and aluminum. Furthermore, examples of an available method of manufacturing the silicon through-via electrode 44a include plating, chemical vapor deposition (CVD), vapor deposition, and sputtering.

As illustrated in FIG. 3, the gate trench electrodes 18a of the active trench gates 18 are electrically connected through the silicon through-via 44 to the final backside gate pad 42f formed on the first main surface. Only the collector electrode 7 is exposed on the backside of the double gate RC-IGBT 100 in this structure.

This can prevent shorts between a backside gate and the collector electrode which may occur when a double gate RC-IGBT chip is packaged. Thus, a circuit pattern of a ceramic substrate with a circuit pattern for packaging a double gate RC-IGBT chip can sidestep constraints on the backside pattern of the chip.

Since the silicon through-via electrode 44a forms an interconnection path from the backside gate pad 46 to the final backside gate pad 42f, the length of the interconnection path is almost identical to the thickness of the semiconductor substrate, and the interconnection path is shortened. Thus, the parasitic inductance is smaller, and the fast control is possible.

Each double gate RC-IGBT is sometimes operated under injected carrier control in several microseconds or with pulse waveforms corresponding to the several microseconds or less. Gates on the backside, that is, control gates perform the injected carrier control for controlling an amount of carriers in a semiconductor. Thus, the double gate RC-IGBT 100 that can be controlled faster is very advantageous.

Furthermore, only the collector electrode is exposed on the backside pattern of the double gate RC-IGBT 100 as in conventional RC-IGBTs. Thus, the chips can be interconnected by conventional soldering and wire bonding. This does not require new equipment, and enables high volume production.

Furthermore, the silicon through-via insulating film 44b can be thinned to form the silicon through-via 44 in the rim region with a collector potential. Furthermore, the leakage current can be suppressed low because the silicon through-via 44 is not between the main electrodes.

As illustrated in FIG. 1, the lower portion of one of the corners of the final backside gate pad 42f includes the silicon through-via 44. Thus, the diameter of the silicon through-via 44 can be increased, the wire resistance can be reduced, and the reliability can be enhanced.

Forming the silicon through-via 44 at the lower portion of the final backside gate pad 42f can connect the final backside gate pad 42f to the silicon through-via 44 with the shortest length. This can reduce the wire resistance.

The electrical resistance of the silicon through-via 44 can be arbitrarily set by selecting a material of the silicon through-via electrode 44a. In other words, the silicon through-via 44 is available as a resistor. Thus, setting the electrical resistance of an interconnection path from the gate trench electrodes 18a to the final backside gate pad 42f through the silicon through-via 44 from 1Ω to 100Ω negates the need for connecting an outboard gate resistor to the active trench gates 18.

Embodiment 2

FIG. 4 is a plan view illustrating the front pattern 101 on which the emitter electrode 6 is disposed in a double gate RC-IGBT 200 according to Embodiment 2 of the present disclosure. The double gate RC-IGBT 100 in FIG. 1 includes the silicon through-via 44 at the lower portion of one of the corners of the final backside gate pad 42f. This corner is identical in dimension to the other three corners. In the double gate RC-IGBT 200 illustrated in FIG. 4, the silicon through-via 44 at a corner of the final backside gate pad 42f has an area larger than those of the other three corners. Thus, the diameter of the silicon through-via 44 can be increased, and the perimeter of the silicon through-via 44 can have a margin. Increasing the area of the corner of the final backside gate pad 42f at which the silicon through-via 44 is formed widens a wire bonding region, and facilitates the wire bonding.

Figure 5:
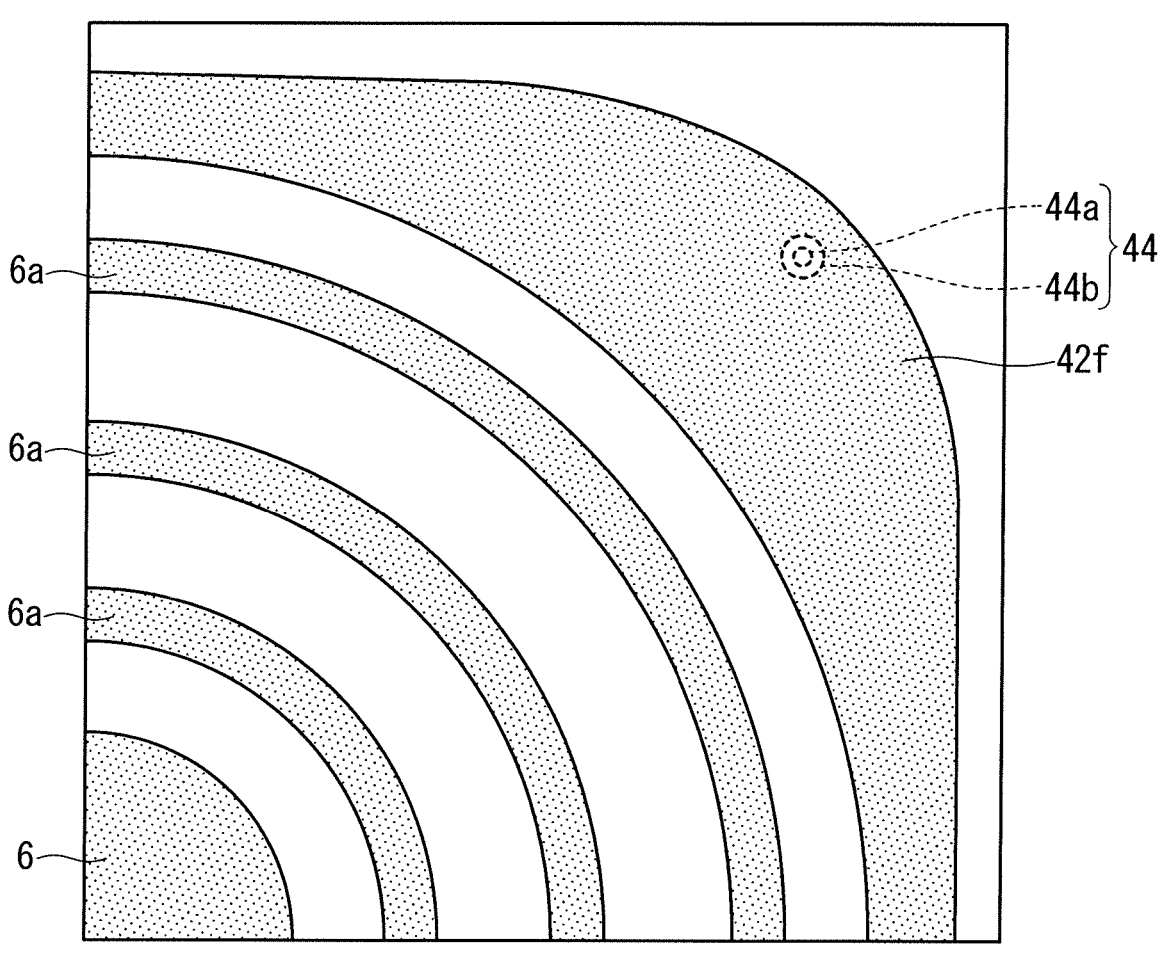
FIG. 5 is an enlarged partial view of the front pattern of the double gate RC-IGBT according to Embodiment 2 of the present disclosure.

FIG. 5 is an enlarged view of the corner of the final backside gate pad 42f at which the silicon through-via 44 is formed in FIG. 4. Although the silicon through-via 44 covered with the final backside gate pad 42f cannot be visually checked from the top, the silicon through-via 44 is illustrated by broken lines for convenience.

FIG. 6 is a plan view illustrating the front pattern 101 on which the emitter electrode 6 is disposed in a double gate RC-IGBT 201 according to a modification of Embodiment 2 of the present disclosure. In the double gate RC-IGBT 201 illustrated in FIG. 6, the silicon through-via 44 is formed in a portion at which a part of one side of the final backside gate pad 42f has been enlarged. Thus, the diameter of the silicon through-via 44 can be increased, and the perimeter of the silicon through-via 44 can have a margin.

Figure 7:
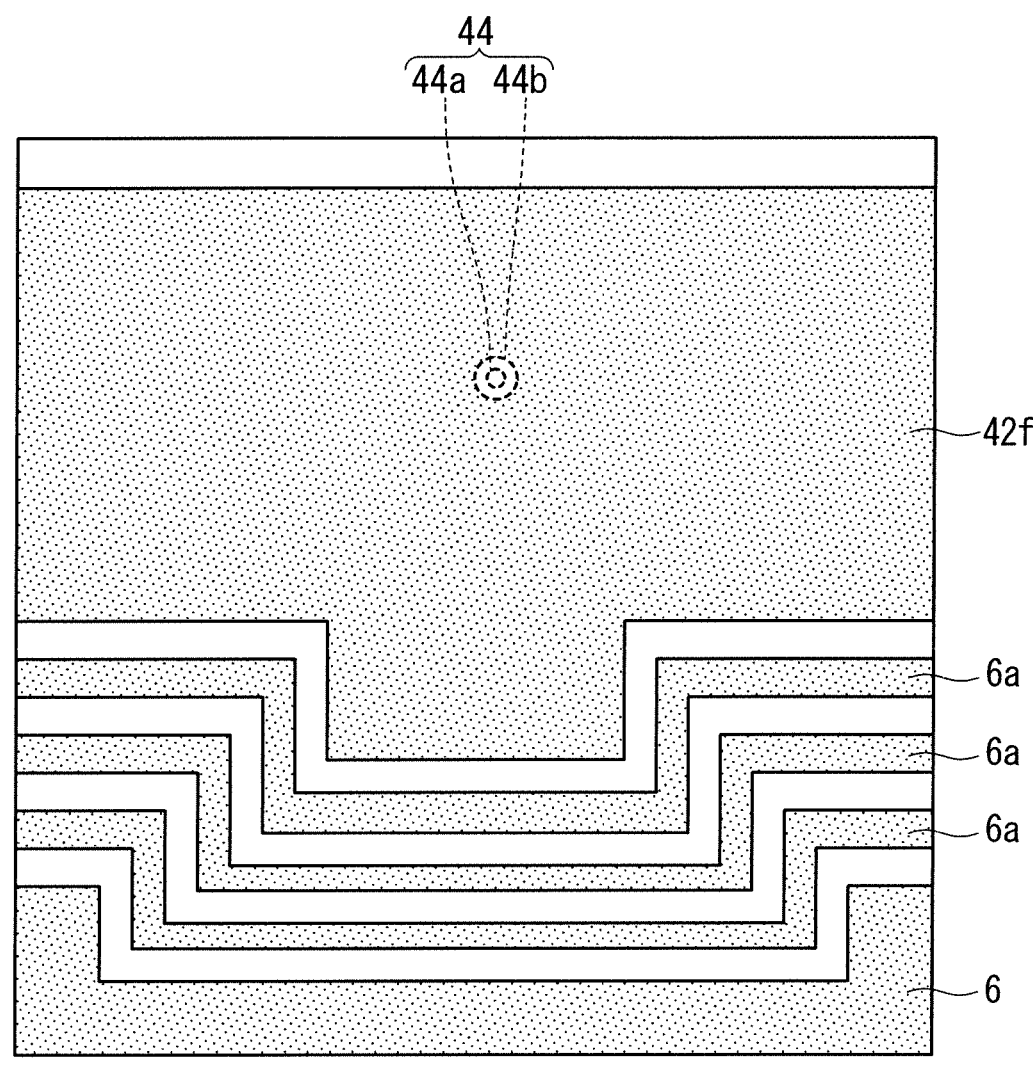
FIG. 7 is an enlarged partial view of the front pattern of the double gate RC-IGBT according to the modification of Embodiment 2 of the present disclosure.

FIG. 7 is an enlarged view of the part of one side of the final backside gate pad 42f at which the silicon through-via 44 is formed in FIG. 6. Although the silicon through-via 44 covered with the final backside gate pad 42f cannot be visually checked from the top, the silicon through-via 44 is illustrated by broken lines for convenience.

Embodiment 3

FIG. 8 is a plan view illustrating the front pattern 101 on which the emitter electrode 6 is disposed in a double gate RC-IGBT 300 according to Embodiment 3 of the present disclosure. As illustrated in FIG. 8, the double gate RC-IGBT 300 includes two silicon through-vias 44 at respective lower portions of corners of the final backside gate pad 42f that are diagonally opposite to each other.

Since the two corners of the final backside gate pad 42f that are diagonally opposite to each other are connected to each other by the final backside gate pad 42f surrounding the rim region of the terminal region 30, the junctions have low resistance and high reliability.

Figure 9:
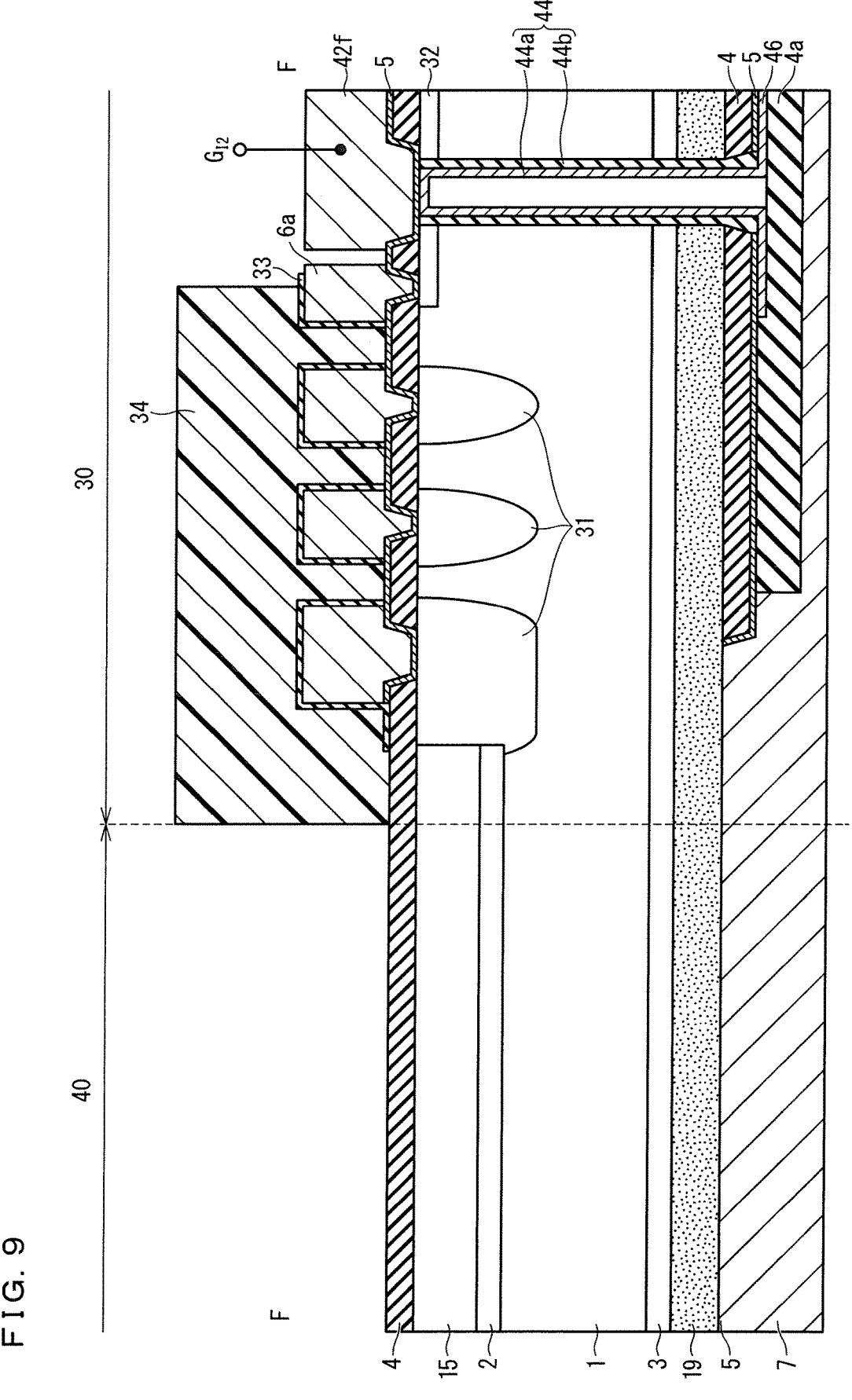
FIG. 9 is a partial cross-sectional view of the double gate RC-IGBT according to Embodiment 3 of the present disclosure.

FIG. 9 is a cross-sectional view taken along an alternate long and short dashed line F-F of the double gate RC-IGBT 300 in FIG. 8. Although a cross-sectional view taken along an alternate long and short dashed line E-E of FIG. 9 is identical to that in FIG. 3, the cross-sectional view taken along the alternate long and short dashed line F-F is a cross-sectional view of a boundary between the pad region 40 and the terminal region 30. As illustrated in FIG. 9, the pad region 40 does not include the active trench gates 11. The cross-sectional view of the terminal region 30 is identical to that of the terminal region 30 in FIG. 3.

FIG. 10 is a plan view illustrating the backside pattern 102 on which the collector electrode 7 is disposed in the double gate RC-IGBT 300. As illustrated in FIG. 10, the two silicon through-vias 44 are electrically connected to each other via a backside gate wire 43 surrounding the rim region of the terminal region 30 (FIG. 8). The backside gate wire 43 not only surrounds the rim region of the terminal region 30 but also crosses the cell region. The backside gate wire 43 is a wire with low resistance and high reliability. Increasing the number of wires connected to the backside gate wire 43 in parallel can further reduce the resistance of the backside gate wire 43.

The positions at which the silicon through-vias 44 are formed are not limited to the lower portions of the two corners of the final backside gate pad 42*f* that are diagonally opposite to each other, but can be portions at which parts of two sides of the final backside gate pad 42*f* have been enlarged.

The number of the silicon through-vias 44 is not limited to two. Increasing the number of the silicon through-vias 44 can not only reduce the wire resistance but also enhance the reliability.

Embodiment 4

FIG. 11 is a plan view illustrating the front pattern 101 on which the emitter electrode 6 is disposed in a double gate RC-IGBT 400 according to Embodiment 4 of the present disclosure. As illustrated in FIG. 11, the double gate RC-IGBT 400 includes the silicon through-via 44 at the lower portion of one of the corners of the final backside gate pad 42*f*. The silicon through-via 44 is not formed at a lower portion of a corner diagonally opposite to the corner at which the silicon through-via 44 is formed. The lower portion of the final backside gate pad 42*f* is used as a wire bonding region 47.

Figure 12:
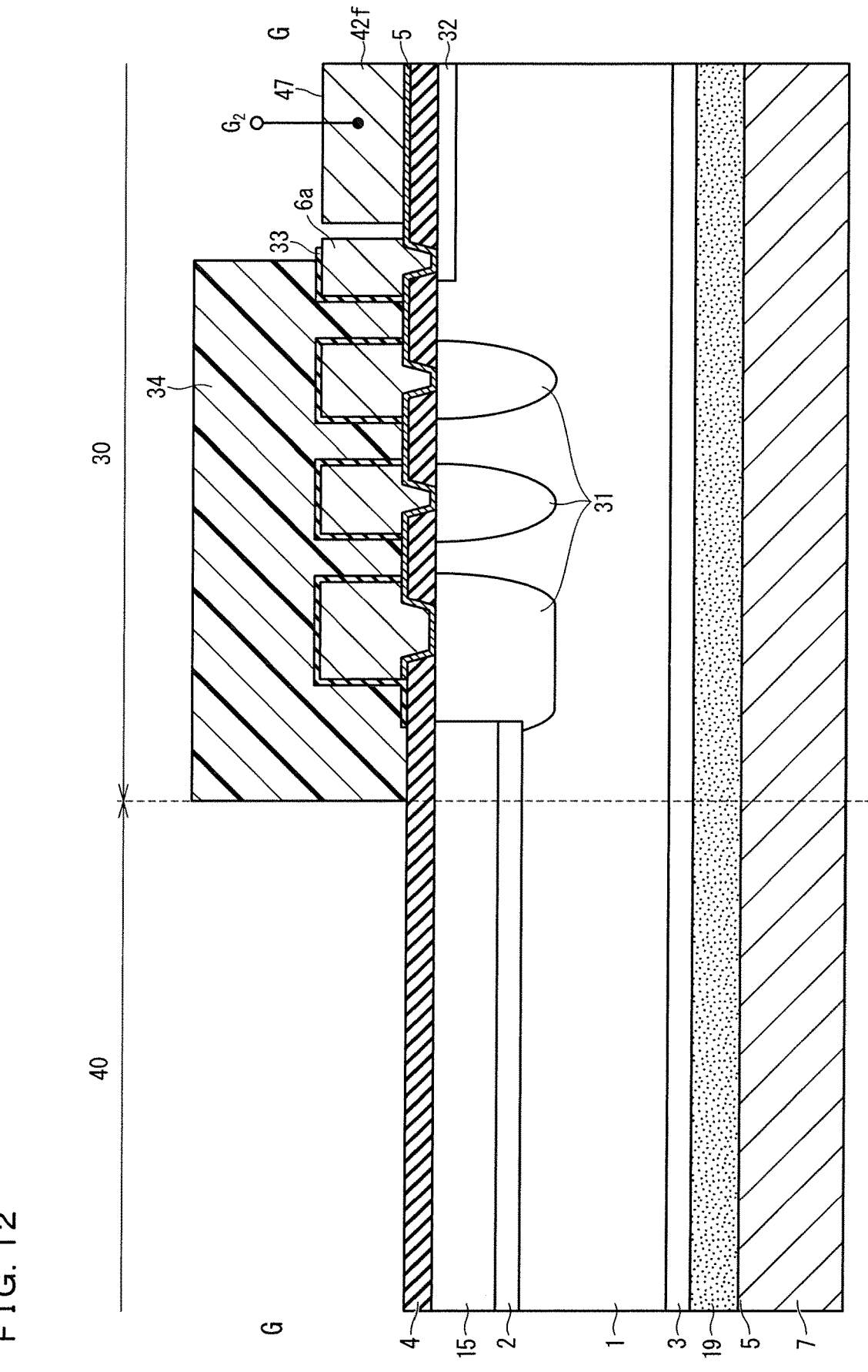
FIG. 12 is a partial cross-sectional view of the double gate RC-IGBT according to Embodiment 4 of the present disclosure.

FIG. 12 is a cross-sectional view taken along an alternate long and short dashed line G-G of the double gate RC-IGBT 400 in FIG. 11. As illustrated in FIG. 12, the silicon through-via 44 is not formed at a lower portion of the final backside gate pad 42*f*.

A portion with the silicon through-via 44 is structurally weak. Having different structures in films formed on the semiconductor substrate may cause differences in thickness between the portion with the silicon through-via 44 and the other portions. Thus, using a region other than the portion with the silicon through-via 44 as the wire bonding region 47 can prevent, for example, cracks in bonding.

FIG. 13 is a plan view illustrating the backside pattern 102 on which the collector electrode 7 is disposed in the double gate RC-IGBT 400. As illustrated in FIG. 13, the silicon through-via 44 is electrically connected to the backside gate wire 43 surrounding the rim region of the terminal region 30 (FIG. 11). The backside gate wire 43 also crosses the cell region. As long as the silicon through-via 44 does not overlap the wire bonding region 47, their position relationship can be freely set. For example, the silicon through-via 44 and the wire bonding region 47 may be placed at the same corner with displacements.

Embodiment 5

FIG. 14 is a plan view illustrating the front pattern 101 on which the emitter electrode 6 is disposed in a double gate RC-IGBT 500 according to Embodiment 5 of the present disclosure. As illustrated in FIG. 14, the double gate RC-IGBT 500 includes a collector sense pad 42*g* (a main electrode pad) around a rim region further outside the terminal electrodes 6*a*. A silicon through-via 45 (a second through-via) is formed at a lower portion of a part of one side of the collector sense pad 42*g*. Although the silicon through-via 45 covered with the collector sense pad 42*g* cannot be visually checked from the top, the silicon through-via 45 is illustrated by broken lines for convenience.

Furthermore, the final backside gate pad 42*f* is formed at one corner of a double gate RC-IGBT chip, and the silicon through-via 44 is formed at a lower portion of the final backside gate pad 42*f*. Although the silicon through-via 44 covered with the final backside gate pad 42*f* cannot be visually checked from the top, the silicon through-via 44 is illustrated by broken lines for convenience.

FIG. 15 is an enlarged view of the corner with the final backside gate pad 42*f* in FIG. 14. The final backside gate pad 42*f* is electrically separated from the collector sense pad 42*g*. The collector sense pad 42*g* is electrically separated from the terminal electrodes 6*a*.

Figure 16:
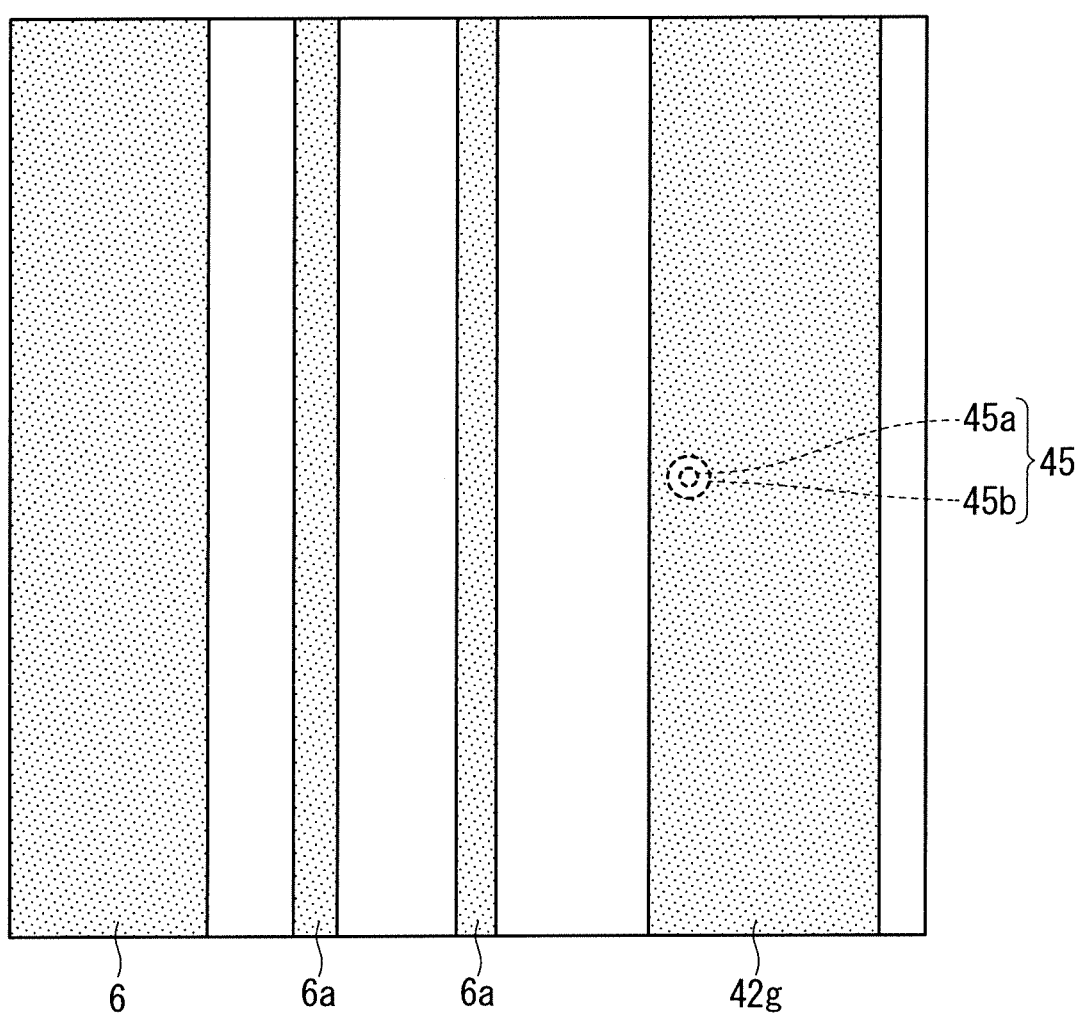
FIG. 16 is an enlarged partial view illustrating the front pattern of the double gate RC-IGBT according to Embodiment 5 of the present disclosure.

FIG. 16 is an enlarged view of the part of one side of the collector sense pad 42*g* in FIG. 14. Since the collector sense pad 42*g* is electrically connected to the collector electrode 7 through the silicon through-via 45, a wire for monitoring a collector voltage C can be placed on the front of the double gate RC-IGBT chip. This facilitates monitoring the collector voltage C.

Furthermore, a silicon through-via insulating film 45*b* can be thinned to form the silicon through-via 45 in the rim region with the collector potential. Furthermore, the leakage current can be suppressed low because the silicon through-via 45 is not between the main electrodes.

Figure 18:
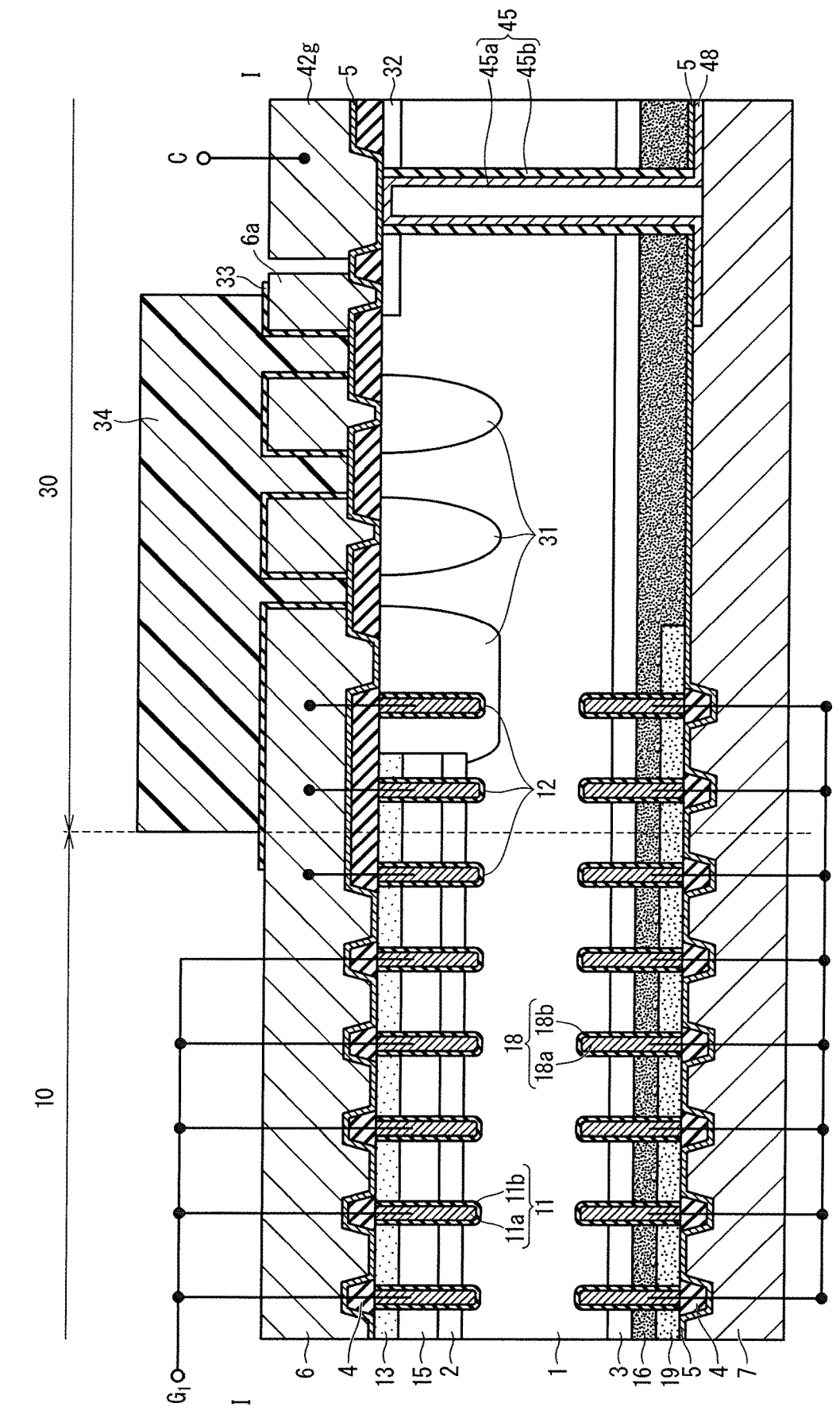
FIG. 18 is a partial cross-sectional view of the double gate RC-IGBT according to Embodiment 5 of the present disclosure.

FIG. 17 is a cross-sectional view taken along an alternate long and short dashed line H-H in the double gate RC-IGBT 500 in FIG. 14, and FIG. 18 is a cross-sectional view taken along an alternate long and short dashed line I-I in FIG. 14. The cross-sectional structure in FIG. 17 is identical to that of the double gate RC-IGBT 100 in FIG. 3.

As illustrated in FIG. 18, the silicon through-via 45 includes the silicon through-via insulating film 45*b* covering an inner wall of a via hole penetrating the semiconductor substrate in the thickness direction, and a silicon through-via electrode 45*a* covering an inner wall of the silicon through-via insulating film 45*b*. The silicon through-via electrode 45*a* also covers the barrier metal 5 around the via hole on the second main surface side. The silicon through-via electrode 45*a* is connected to the barrier metal 5 on the first main surface side, and is electrically connected to the collector sense pad 42*g* through the barrier metal 5.

The silicon through-via electrode 45*a* covering the barrier metal 5 around the via hole can be referred to as a backside collector pad 48.

The silicon through-via 45 and the backside collector pad 48 around the silicon through-via 45 are covered with the collector electrode 7. The collector electrode 7 is electrically connected to the collector sense pad 42*g* through the silicon through-via electrode 45*a*.

Other Applications

Although Embodiments 1 to 5 describe the structure of the silicon through-via 44 and the silicon through-via 45 in the terminal region 30, the silicon through-via 44 and the silicon through-via 45 can be formed in the pad region 40. Since the pad region 40 is a region in which external wires are connected to the double gate RC-IGBT chip, disposing the final backside gate pad 42*f* and the collector sense pad 42*g* together with the silicon through-via 44 and the silicon through-via 45, respectively, in the pad region 40 facilitates connection of the external wires.

Embodiments can be freely combined, and appropriately modified or omitted within the scope of the present disclosure.

The following will describe a summary of the present disclosure as appendixes.

Appendix 1

A semiconductor device including a semiconductor substrate with a first main surface and a second main surface which face one another, the semiconductor device comprising:

a first semiconductor layer of a first conductivity type, the first semiconductor layer being formed between the first main surface and the second main surface of the semiconductor substrate;

a second semiconductor layer of a second conductivity type, the second semiconductor layer being formed between the first semiconductor layer and the first main surface;

a third semiconductor layer of the first conductivity type, the third semiconductor layer being selectively formed on the second semiconductor layer on the first main surface side;

a fourth semiconductor layer of the second conductivity type, the fourth semiconductor layer being formed between the first semiconductor layer and the second main surface;

a fifth semiconductor layer of the first conductivity type, the fifth semiconductor layer being selectively formed on the fourth semiconductor layer on the second main surface side;

a first main electrode on the first main surface, the first main electrode being electrically connected to the second semiconductor layer and the third semiconductor layer;

a second main electrode on the second main surface, the second main electrode being electrically connected to the fourth semiconductor layer and the fifth semiconductor layer;

a first control electrode switching between conduction and non-conduction between the first semiconductor layer and the third semiconductor layer according to a first control signal;

a second control electrode switching between conduction and non-conduction between the first semiconductor layer and the fifth semiconductor layer according to a second control signal;

a first control electrode pad on the first main surface, the first control electrode pad being electrically connected to the first control electrode;

a breakdown voltage maintaining structure in a terminal region surrounding a pad disposing region on which the first main electrode and the first control electrode pad are disposed;

a first through-via including a conductor electrically connecting the first main surface to the second main surface, the first through-via penetrating the semiconductor substrate in a thickness direction; and a second control electrode pad on the first main surface, the second control electrode pad being electrically connected to the second control electrode through the first through-via.

Appendix 2

The semiconductor device according to appendix 1, wherein the first through-via is formed in a rim region in the terminal region, the rim region being closer to a side surface of the semiconductor substrate than to the breakdown voltage maintaining structure.

Appendix 3

The semiconductor device according to appendix 2, wherein the first through-via is formed at a position corresponding to a corner of the semiconductor substrate.

Appendix 4

The semiconductor device according to appendix 2, wherein the first through-via is formed at each of positions of the terminal region.

Appendix 5

The semiconductor device according to appendix 2, wherein the first through-via is formed at a lower portion of the second control electrode pad.

Appendix 6

The semiconductor device according to appendix 5, wherein the second control electrode pad includes a wire bonding region in a region at a lower portion of which the first through-via is not formed.

Appendix 7

The semiconductor device according to appendix 2, wherein the second control electrode pad is formed to surround the rim region.

Appendix 8

The semiconductor device according to appendix 2, wherein the first through-via is electrically connected to a wire surrounding the rim region on the second main surface.

Appendix 9

The semiconductor device according to appendix 1, further comprising:

a second through-via including a conductor electrically connecting the first main surface to the second main surface, the second through-via penetrating the semiconductor substrate in the thickness direction; and a main electrode pad on the first main surface, the main electrode pad being electrically connected to the second main electrode through the second through-via.

Appendix 10

The semiconductor device according to appendix 9, wherein the second through-via is formed in a rim region in the terminal region, the rim region being closer to a side surface of the semiconductor substrate than to the breakdown voltage maintaining structure.

Appendix 11

The semiconductor device according to any one of appendixes 1 to 10, wherein an interconnection path from the second control electrode to the second control electrode pad through the first through-via has an electrical resistance ranging from 1Ω to 100Ω.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device including a semiconductor substrate with a first main surface and a second main surface which face one another, the semiconductor device comprising:

a first semiconductor layer of a first conductivity type, the first semiconductor layer being formed between the first main surface and the second main surface of the semiconductor substrate;

a second semiconductor layer of a second conductivity type, the second semiconductor layer being formed between the first semiconductor layer and the first main surface;

a third semiconductor layer of the first conductivity type, the third semiconductor layer being selectively formed on the second semiconductor layer on the first main surface side;

a fourth semiconductor layer of the second conductivity type, the fourth semiconductor layer being formed between the first semiconductor layer and the second main surface;

a fifth semiconductor layer of the first conductivity type, the fifth semiconductor layer being selectively formed on the fourth semiconductor layer on the second main surface side;

a first main electrode on the first main surface, the first main electrode being electrically connected to the second semiconductor layer and the third semiconductor layer;

a second main electrode on the second main surface, the second main electrode being electrically connected to the fourth semiconductor layer and the fifth semiconductor layer;

a first control electrode switching between conduction and non-conduction between the first semiconductor layer and the third semiconductor layer according to a first control signal;

a second control electrode switching between conduction and non-conduction between the first semiconductor layer and the fifth semiconductor layer according to a second control signal;

a first control electrode pad on the first main surface, the first control electrode pad being electrically connected to the first control electrode;

a breakdown voltage maintaining structure in a terminal region surrounding a pad disposing region on which the first main electrode and the first control electrode pad are disposed;

a first through-via including a conductor electrically connecting the first main surface to the second main surface, the first through-via penetrating the semiconductor substrate in a thickness direction; and a second control electrode pad on the first main surface, the second control electrode pad being electrically connected to the second control electrode through the first through-via.

2. The semiconductor device according to claim 1, wherein the first through-via is formed in a rim region in the terminal region, the rim region being closer to a side surface of the semiconductor substrate than to the breakdown voltage maintaining structure.

3. The semiconductor device according to claim 2, wherein the first through-via is formed at a position corresponding to a corner of the semiconductor substrate.

4. The semiconductor device according to claim 2, wherein the first through-via is formed at each of positions of the terminal region.

5. The semiconductor device according to claim 2, wherein the first through-via is formed at a lower portion of the second control electrode pad.

6. The semiconductor device according to claim 5, wherein the second control electrode pad includes a wire bonding region in a region at a lower portion of which the first through-via is not formed.

7. The semiconductor device according to claim 2, wherein the second control electrode pad is formed to surround the rim region.

8. The semiconductor device according to claim 2, wherein the first through-via is electrically connected to a wire surrounding the rim region on the second main surface.

9. The semiconductor device according to claim 1, further comprising:

a second through-via including a conductor electrically connecting the first main surface to the second main surface, the second through-via penetrating the semiconductor substrate in the thickness direction; and a main electrode pad on the first main surface, the main electrode pad being electrically connected to the second main electrode through the second through-via.

10. The semiconductor device according to claim 9, wherein the second through-via is formed in a rim region in the terminal region, the rim region being closer to a side surface of the semiconductor substrate than to the breakdown voltage maintaining structure.

11. The semiconductor device according to claim 1, wherein an interconnection path from the second control electrode to the second control electrode pad through the first through-via has an electrical resistance ranging from 1Ω to 100Ω.

* * * * *